(12) United States Patent
Maesawa et al.

(10) Patent No.: US 7,312,014 B2
(45) Date of Patent: Dec. 25, 2007

(54) RESIST COMPOSITIONS

(75) Inventors: Tsuneaki Maesawa, Kawagoe (JP); Fumiyoshi Urano, Kawagoe (JP)

(73) Assignee: Wako Pure Chemical Industries Ltd., Osaka (JP)

( * ) Notice: Subject to any disclaimer, the term of this patent is extended or adjusted under 35 U.S.C. 154(b) by 134 days.

(21) Appl. No.: 10/480,794

(22) PCT Filed: Jun. 21, 2002

(86) PCT No.: PCT/JP02/06218

§ 371 (c)(1),
(2), (4) Date: Dec. 19, 2003

(87) PCT Pub. No.: WO03/007079

PCT Pub. Date: Jan. 23, 2003

(65) Prior Publication Data

US 2004/0170918 A1    Sep. 2, 2004

(30) Foreign Application Priority Data

Jun. 22, 2001  (JP)  ............................. 2001-189003

(51) Int. Cl.
    *G03F 7/004*    (2006.01)
(52) U.S. Cl. .................... 430/270.1; 430/905; 430/910
(58) Field of Classification Search ............. 430/270.1, 430/905, 910, 921
    See application file for complete search history.

(56) References Cited

U.S. PATENT DOCUMENTS

| | | | |
|---|---|---|---|
| 5,679,495 A | 10/1997 | Yamachika et al. | 430/191 |
| 6,106,993 A | 8/2000 | Watanabe et al. | 430/270.1 |
| 6,136,504 A | 10/2000 | Tan et al. | 430/270.1 |
| 6,255,041 B1 | 7/2001 | Oomori et al. | 430/322 |
| 6,265,135 B1 | 7/2001 | Kodama et al. | 430/286.1 |
| 6,372,406 B1 | 4/2002 | Brunsvold et al. | 430/270.1 |
| 6,489,080 B2 * | 12/2002 | Uenishi et al. | 430/281.1 |
| 6,645,698 B1 | 11/2003 | Thackeray et al. | 430/285.1 |
| 6,899,989 B2 * | 5/2005 | Suzuki et al. | 430/270.1 |
| 2002/0119393 A1 | 8/2002 | Yukawa et al. | 430/270 |

FOREIGN PATENT DOCUMENTS

| | | |
|---|---|---|
| JP | 07-209868 | 8/1995 |
| JP | 07-261377 | 10/1995 |
| JP | 08-179500 | 7/1996 |
| JP | 09-160246 | 6/1997 |
| JP | 09-211866 | 8/1997 |
| JP | 11-167200 | 6/1999 |
| JP | 11-305440 | 11/1999 |
| JP | 11-344808 | 12/1999 |
| JP | 2000-066382 | 3/2000 |
| JP | 2000-066401 | 3/2000 |
| JP | 2000-089453 | 3/2000 |
| JP | 2000-122296 | 4/2000 |
| JP | 2000-187330 | 7/2000 |
| JP | 2001-142214 | 5/2001 |

OTHER PUBLICATIONS

H. Ito et al., "Dissolution Kinetics and PAG Interaction of Phenolic Resins in Chemically Amplified Resists", *J. Photopolym. Sci. Technol.*, 1997, 10(3), pp. 397-408.
H. Ito et al., "Lithographic Feasibility of ESCAP Beyond Quarter Micron", *J. Photopolym. Sci. Technol.*, 1996, 9(4), pp. 557-572.
H. Ito et al., "Microelectronics Technology—Polymers for Advanced Imaging and Packaging", *ACS Symp. Ser.*, 1995, 614, pp. 21-34.
International Search Report dated Oct. 15, 2002.
Supplementary European Search Report of May 11, 2006.

* cited by examiner

*Primary Examiner*—John S. Chu
(74) *Attorney, Agent, or Firm*—Kratz, Quintos & Hanson, LLP

(57) ABSTRACT

The present invention relates to a resist composition for practical use with high resolution, high sensitivity, superior pattern profile and no outgas in energy irradiation under high vacuum, suitable to an ultra-fine processing technology represented by use of electron beam and the like, and provides: (1) a resist composition comprising at least one kind of polymer containing, as components thereof, a monomer unit represented by the following general formula [1]:

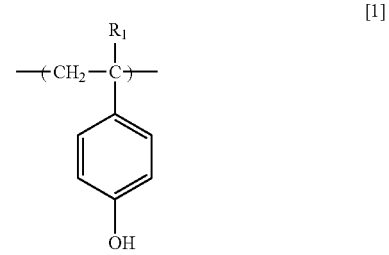

a monomer unit represented by the following general formula [2]:

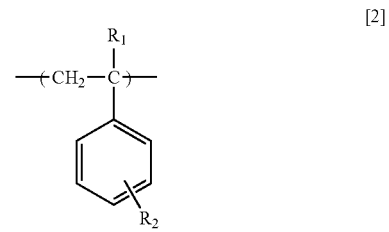

and a monomer unit represented by the following general formula [3]:

at least one kind of compound to generate an acid by irradiation of radioactive ray, represented by the following general formula [4]; an organic basic compound; and a solvent, (2) the resist composition in accordance with (1), further containing a polymer unit represented by the following general formula [13]:

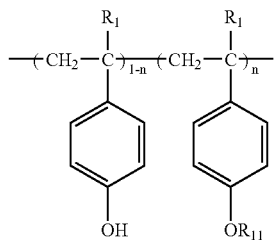

[13]

and, (3) the resist composition in accordance with (1) and (2), further containing a compound represented by the following general formula [4]:

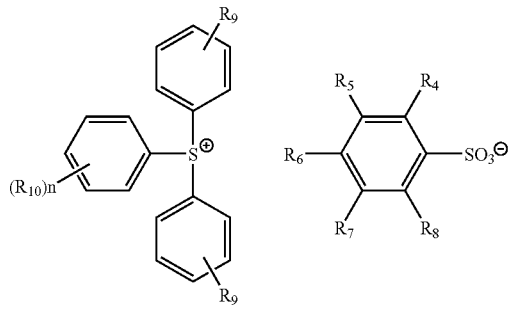

[4]

as a compound to generate an acid by irradiation of radioactive ray.

24 Claims, 3 Drawing Sheets

RESIST COMPOSITIONS

TECHNICAL FIELD

The present invention relates to a resist composition, used in manufacturing of semiconductor elements and the like, in formation of a positive pattern using a transcription technology in vacuum with irradiated energy such as electron beam, extreme ultraviolet ray and X-ray.

PRIOR ART

With recent higher density integration in semiconductor devices, an energy source of exposure equipment used in fine processing, in particular, photolithography, is shifting to further and further shorter wavelength side, and now deep ultraviolet light (300 nm or shorter) and KrF excimer laser (248 nm) are in practical use, moreover ArF excimer laser (193 nm) is also realizing practical use, but these technologies cannot be used in ultra-fine processing of 100 nm or shorter due to a problem of resolution performance. To solve this problem, transcription technologies using $F_2$ laser light (157 nm) or electron beam have been studied, but a resist composition suitable not only for the $F_2$ laser light but also for the electron beam has not yet been found.

With regard to an electron beam resist, a resist composition of main chain scission type (for example in JP-A-1-163738) is used in mask preparation and the like, but it can not be used for an application such as a design rule of ultra-fine processing aiming at manufacturing of semiconductor element due to too low sensitivity and insufficient resolution. To solve these problems, a chemically amplified resist using a catalytic action of an acid generated by energy irradiation has been studied in recent years with many reports. However, it still has many problems in practical use.

For example, JP-A-7-209868, JP-A-11-305440 and JP-A-2000-66401 disclose a resist composition prepared by combining poly(hydroxystyrene/styrene/tert-butyl acrylate) and triphenylsulfonium trifluoromethanesulfonate, and JP-A-7-261377 and JP-A-8-179500 also disclose a resist composition prepared by combining of mixed polymers of poly(p-hydroxystyrene/styrene/tert-butyl acrylate) and poly(p-hydroxystyrene/tert-butyl acrylate) and triphenylsulfonium trifluoromethanesulfonate. However, because of too high volatility and easy diffusion of trifuloromethanesulfonic acid generated by energy irradiation, said acid evaporates or moves during a process from exposure to heat treatment, under conditions of a high vacuum state for a long period such as a case using electron beam, resulting in failing to form an ultra-fine pattern with a required profile.

For example, JP-A-2000-66382 discloses a resist composition prepared by combining poly(p-hydroxystyrene/styrene/tert-butyl acrylate) and triphenylsulfonium p-toluenesulfonate, but an ultra-fine pattern with high throughput has not been obtained, due to too low sensitivity coming from weak acidity of p-toluenesulfonic acid generated by energy irradiation.

For example, JP-A-8-146610 discloses a resist composition prepared by combining poly(p-hydroxystyrene/tert-amyl methacrylate) and triphenylsulfonium trifluoromethanesulfonate, and H. Ito et al., J. Photopolym. Sci. Technol., 1997, 10(3), 397-408; H. Ito et al., J. Photopolym. Sci. Technol., 1996, 9 (4), 557-572; JP-A-7-261377 and JP-A-8-179500 disclose a resist composition prepared by combining poly(p-hydroxystyrene/tert-butyl acrylate) and triphenylsulfonium trifluoromethanesulfonate, respectively, but similarly to the above, a superior ultrafine pattern has not been formed, because of the volatility and diffusion problems of trifluoromethanesulfonic acid generated by energy irradiation. In addition, even if a fine pattern is formed, it cannot be used practically due to a problem of low dry etching resistance of the polymer.

For example, JP-A-11-305440 discloses a resist composition prepared by combining each of poly(hydroxystyrene/styrene/tert-butyl acrylate) and triphenylsulfonium perfluorobutanesulfonate and JP-A-2000-66382 and the like disclose a resist composition prepared by combining poly (p-hydroxystyrene/styrene/tert-butyl acrylate) and triphenylsulfonium perfluorobutanesulfonate, but they have problems of poor contrast and low resolution, because of insufficient dissolution inhibition of perfluoroalkanesulfonic acids such as perfluorobutanesulfonic acid generated by energy irradiation, and problem of low sensitivity because of insufficient acidity of the acids.

For example, JP-A-7-209868 discloses a resist composition prepared by combining poly(hydroxystyrene/styrene/tert-butyl acrylate) and N-(trifluoromethylsulfonyloxy)bicyclo-[2,2,1]hept-5-ene-2,3-dicarboxyimide, and H. Ito et al., ACS. Symp. Ser., 1995, vol. 614 (Microelectronics Technology), p 21-34; H. Ito et al., J. Photopolym. Sci. Technol., 1996, 9 (4), 557-572 disclose a resist composition prepared by combining poly(p-hydroxystyrene/tert-butyl acrylate) and N-camphorsulfonyloxynaphthalimide or N-trifluoromethane-sulfonyloxy-5-norbornene-2,3-dicarboxyimide, but they can not be applied to ultra-fine patterning, because trifluoromethanesulfonic acid used in this chemical amplification has similar problems as the above, and camphorsulfonic acid also has problems of weak acidity and insufficient sensitivity, which inhibit practical use.

For example, JP-A-11-167200 and EP-A-813113 disclose a resist composition prepared by combining poly(p-hydroxystyrene/styrene/tert-butyl acrylate) and di-(4-tert-butylphenyl)iodonium camphorsulfonate, JP-A-11-305441 discloses a resist composition prepared by combining poly (hydroxystyrene/styrene/tert-butyl acrylate) and di-(4-tert-butylphenyl)iodonium perfluorobutanesulfonate, and further JP-A-2000-89453 discloses a resist composition prepared by combining poly(hydroxystyrene/tert-butyl acrylate) and di-(4-tert-butylphenyl)iodonium camporsulfonate, respectively. However, use of these iodonium salts gives poor contrast and low sensitivity due to insufficient dissolution inhibiting effect, or gives unfavorable profile and thus low resolution due to too strong dissolution inhibiting effect, which inhibit an application to ultra-fine processing.

For example, JP-A-2000-187330 discloses a resist composition prepared by combining poly(p-1-tert-butoxyethoxystyrene/p-hydroxystyrene) and 4-butoxyphenyldiphenylsulfonium 4-trifluoromethylbenzenesulfonate, JP-A-9-160246 discloses a resist composition prepared by combining poly(p-1-ethoxyethoxystyrene/p-hydroxystyrene/p-tert-butoxystyrene) and diphenyl 4-butoxyphenylsulfonium p-toluenesulfonium, and JP-A-9-211866 discloses a resist composition prepared by combining poly(p-1-methoxypropoxystyrene/p-hydroxystyrene/p-tert-butoxy-carbonyloxystyrene) and tris(4-tert-butoxyphenyl)sulfonium trifluoromethanesulfonate, respectively, but polymers containing these non-cyclic acetal groups as an acid labile group have problems such as an electron beam fluctuation due to a decomposition gas (so called outgas) generated on irradiation of radioactive ray, which inhibits formation of desired patterns or results in a significantly side wall roughness of pattern. Further, when trifuloromethanesulfonic acid is generated, an inhibition layer to dissolution is formed on a surface of the resist because of too high volatility of said acid, which prevents formation of fine pattern.

For example, JP-A-7-261377, JP-A-8-179500 and JP-A-2000-187330 disclose a resist composition prepared by combining poly(p-tert-butoxycarbonylmethoxystyrene/p-hydroxystyrene) and triphenylsulfonium trifluoromethanesulfonate, however, as is similar to the above, a superior ultra-fine pattern has not been formed because of the volatility and diffusion problems of trifluoromethanesulfonic acid generated by energy irradiation.

Further, JP-A-9-160246, JP-A-9-211866, JP-A-11-344808, JP-A-2000-122296 and JP-A-2000-187330 disclose triphenylsulfonium pentafluorobenzenesulfonate, tris(tert-butylphenyl)sulfonium pentafluorobenzenesulfonate, tris(tert-butoxylphenyl)sulfonium pentafluorobenzene-sulfonate, triphenylsulfonium 3-trifluoromethylbenzene-sulfonate and bis(4-methylphenyl)phenylsulfonium 3,5-bis(trifluoromethyl)benzenesulfonate, but every polymer with which these compounds are combined contains a non-cyclic acetal group as an acid labile group, which leads to the similar problems described above (electron beam fluctuation due to an outgas, which leads to failing to form a desired pattern and a side wall roughness of pattern).

As described above, a chemically amplified positive resist, used under vacuum as with electron beam, can not provide a desired pattern, because of high volatility and easy moving of an acid generated by energy irradiation, as well as insufficient dry etching resistance of polymer, poor adhesion to substrate and beam fluctuation due to decomposition and elimination of a protecting group pendant from a polymer during energy irradiation. In addition to these, this resist has a big problem of low acidity of an acid generated by energy irradiation, causing too low sensitivity. Therefore, it is desired now to develop a resist composition that is improved in these problems.

In view of the above-described situation, an object of the present invention is to provide a resist composition for practical use with high resolution, high sensitivity and superior pattern profile for an ultra-fine processing technology represented by use of electron beam, and with low outgasing in energy irradiation under vacuum.

DISCLOSURE OF THE INVENTION

The present invention has been made to solve the above-described problems, and consists of the following:

(1) A resist composition comprising:
at least one kind of polymer containing, as components thereof, a monomer unit represented by the following general formula [1]:

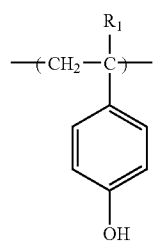

[wherein, $R_1$ is a hydrogen atom or a methyl group]; a monomer unit represented by the following general formula [2]:

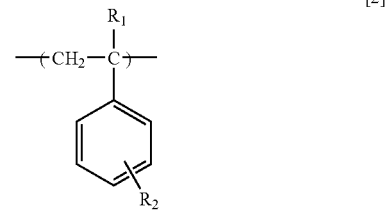

[wherein, $R_1$ is the same as described above; $R_2$ is a hydrogen atom or a linear or a branched alkyl group having 1-4 carbon atoms]; and a monomer unit represented by the following general formula [3]:

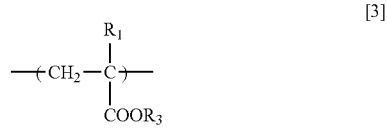

[wherein, $R_1$ is the same as described above; $R_3$ is an acid labile group which can be easily eliminated by an action of acid and bond to a carboxylic acid to form an ester linkage];

at least one kind of compound to generate an acid by irradiation of radioactive ray, represented by the following general formula [4]:

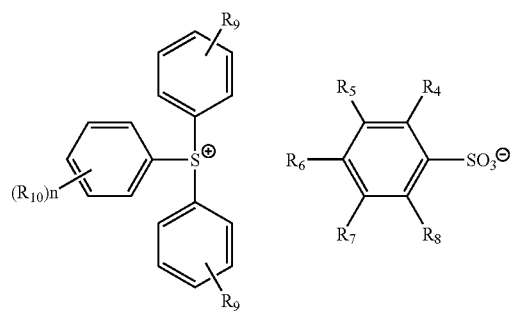

[wherein, each of $R_5$ and $R_7$ is independently a hydrogen atom or an electron-withdrawing group (with a proviso of excluding the case when both of $R_5$ and $R_7$ are simultaneously hydrogen atoms); each of $R_4$, $R_6$ and $R_8$ is independently a hydrogen atom or a halogen atom; each of $R_9$ and $R_{10}$ is independently a hydrogen atom, a halogen atom, a linear or a branched alkyl group having 1-4 carbon atoms, a linear or a branched alkoxy group having 1-4 carbon atoms, a linear or a branched alkoxycarbonyloxy group having 2-5 carbon atoms or a cyclic acetal group having 4-5 carbon atoms; n is an integer of 1-3];

an organic basic compound; and a solvent.

(2) The resist composition in accordance with (1), wherein said polymer is represented by the following general formula [5]:

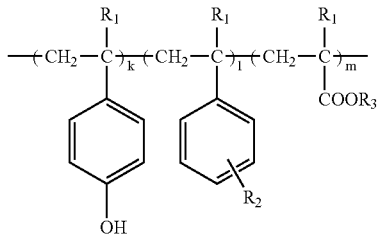

[5]

[wherein, $R_1$, $R_2$ and $R_3$ are the same as described above; k, l and m are integers (with a proviso of $0.25 \geq l/(k+l+m) \geq 0.10$, and $0.20 \geq m/(k+l+m) \geq 0.07$)].

(3) The resist composition in accordance with (2), wherein said compound to generate an acid by irradiation of radioactive ray is a mixture of at least one kind of compound represented by the following general formula [6]:

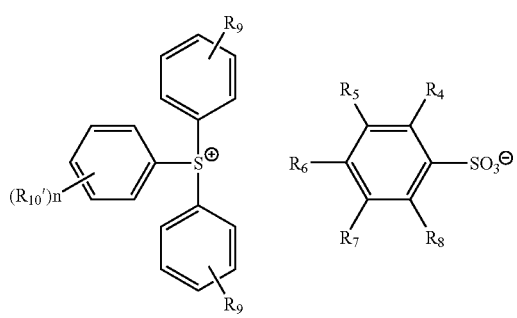

[6]

[wherein, $R_4$, $R_5$, $R_6$, $R_7$, $R_8$, $R_9$ and n are the same as described above; and $R_{10}'$ is a halogen atom, a linear or a branched alkyl group having 1-4 carbon atoms, a linear or a branched alkoxy group having 1-4 carbon atoms, a linear or a branched alkoxycarbonyloxy group having 2-5 carbon atoms or a cyclic acetal group having 4-5 carbon atoms]; and at least one kind of compound represented by the following general formula [7]:

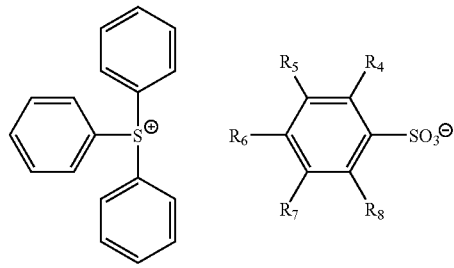

[7]

[wherein, $R_4$, $R_5$, $R_6$, $R_7$ and $R_8$ are the same as described above].

(4) The resist composition in accordance with (1), wherein said compound to generate an acid by irradiation of radioactive ray, is a mixture comprising:
at least one kind of compound represented by the following general formula [6]:

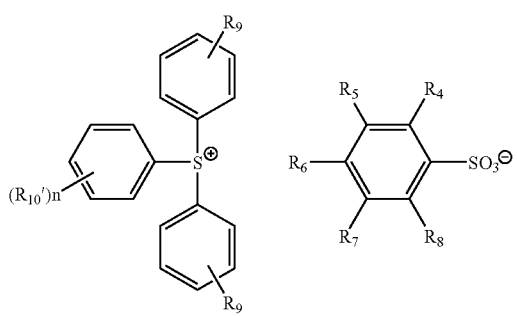

[6]

[wherein, $R_4$, $R_5$, $R_6$, $R_7$, $R_8$, $R_9$ and n are the same as described above; and $R_{10}'$ is a halogen atom, a linear or a branched alkyl group having 1-4 carbon atoms, a linear or a branched alkoxy group having 1-4 carbon atoms, a linear or a branched alkoxycarbonyloxy group having 2-5 carbon atoms or a cyclic acetal group having 4-5 carbon atoms];
at least one kind of compound represented by the following general formula [7]:

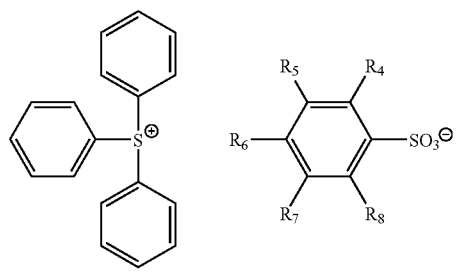

[7]

[wherein, $R_4$, $R_5$, $R_6$, $R_7$ and $R_8$ are the same as described above]; and
at least one kind of compound represented by the following general formula [12]

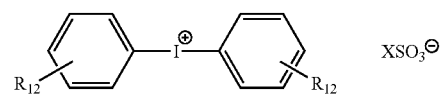

[12]

[wherein, $R_{12}$ is independently a hydrogen atom or a linear or a branched alkyl group having 1-5 carbon atoms; and X is a haloalkyl group having 3-8 carbon atoms or an aryl group optionally having a substitution group].

(5) The resist composition in accordance with (2), wherein said polymer further contains a polymer unit represented by the following general formula [13]:

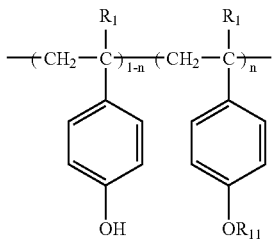

[13]

[wherein, $R_1$ is the same as described above; $R_{11}$ is an acid labile group which can be easily eliminated by an action of acid and bond to a phenol group to form an ether linkage or a carbonate linkage; and n is an integer].

(6) The resist composition in accordance with (5), wherein said compound to generate an acid by irradiation of radioactive ray is a mixture of at least one kind of compound represented by the following general formula [6]:

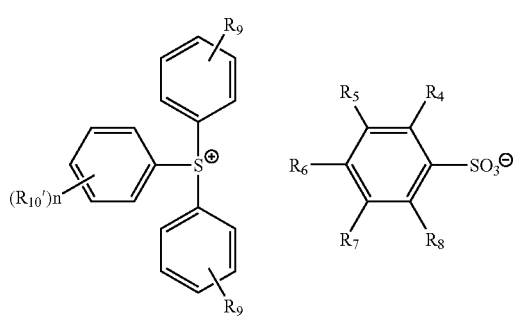

[6]

[wherein, $R_4$, $R_5$, $R_6$, $R_7$, $R_8$, $R_9$ and n are the same as described above; and $R_{10}'$ is a halogen atom, a linear or a branched alkyl group having 1-4 carbon atoms, a linear or a branched alkoxy group having 1-4 carbon atoms, a linear or a branched alkoxycarbonyloxy group having 2-5 carbon atoms or a cyclic acetal group having 4-5 carbon atoms]; and at least one kind of compound represented by the following general formula [7]:

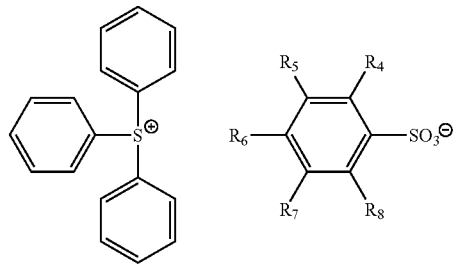

[7]

[wherein, $R_4$, $R_5$, $R_6$, $R_7$ and $R_8$ are the same as described above].

(7) The resist composition in accordance with (5), wherein said compound to generate an acid by irradiation of radioactive ray is a mixture of at least one kind of compound represented by the following general formula [6]:

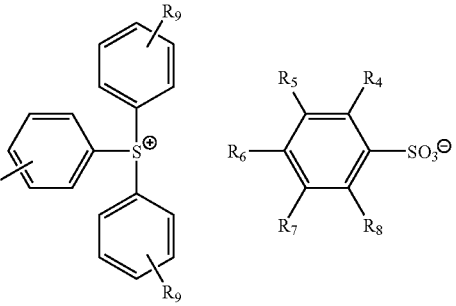

[6]

[wherein, $R_4$, $R_5$, $R_6$, $R_7$, $R_8$, $R_9$ and n are the same as described above; and $R_{10}'$ is a halogen atom, a linear or a branched alkyl group having 1-4 carbon atoms, a linear or a branched alkoxy group having 1-4 carbon atoms, a linear or a branched alkoxycarbonyloxy group having 2-5 carbon atoms or a cyclic acetal group having 4-5 carbon atoms]; and at least one kind of compound represented by the following general formula [7]:

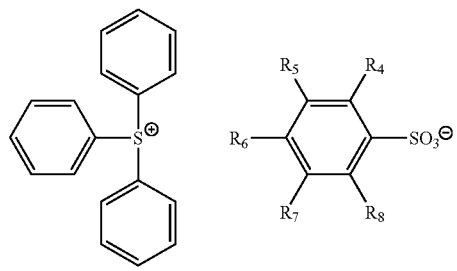

[7]

[wherein, $R_4$, $R_5$, $R_6$, $R_7$ and $R_8$ are the same as described above];

and at least one kind of compound represented by the following general formula [12]:

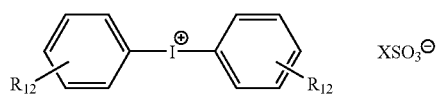

[12]

[wherein, $R_{12}$ is independently a hydrogen atom or a linear or a branched alkyl groups having 1-5 carbon atoms; and X is a haloalkyl group having 3-8 carbon atoms or an aryl group optionally having a substitution group selected from a halogen atom, a lower haloalkyl group and a nitro group].

BEST MODE FOR CARRYING OUT THE INVENTION

Figure 1:
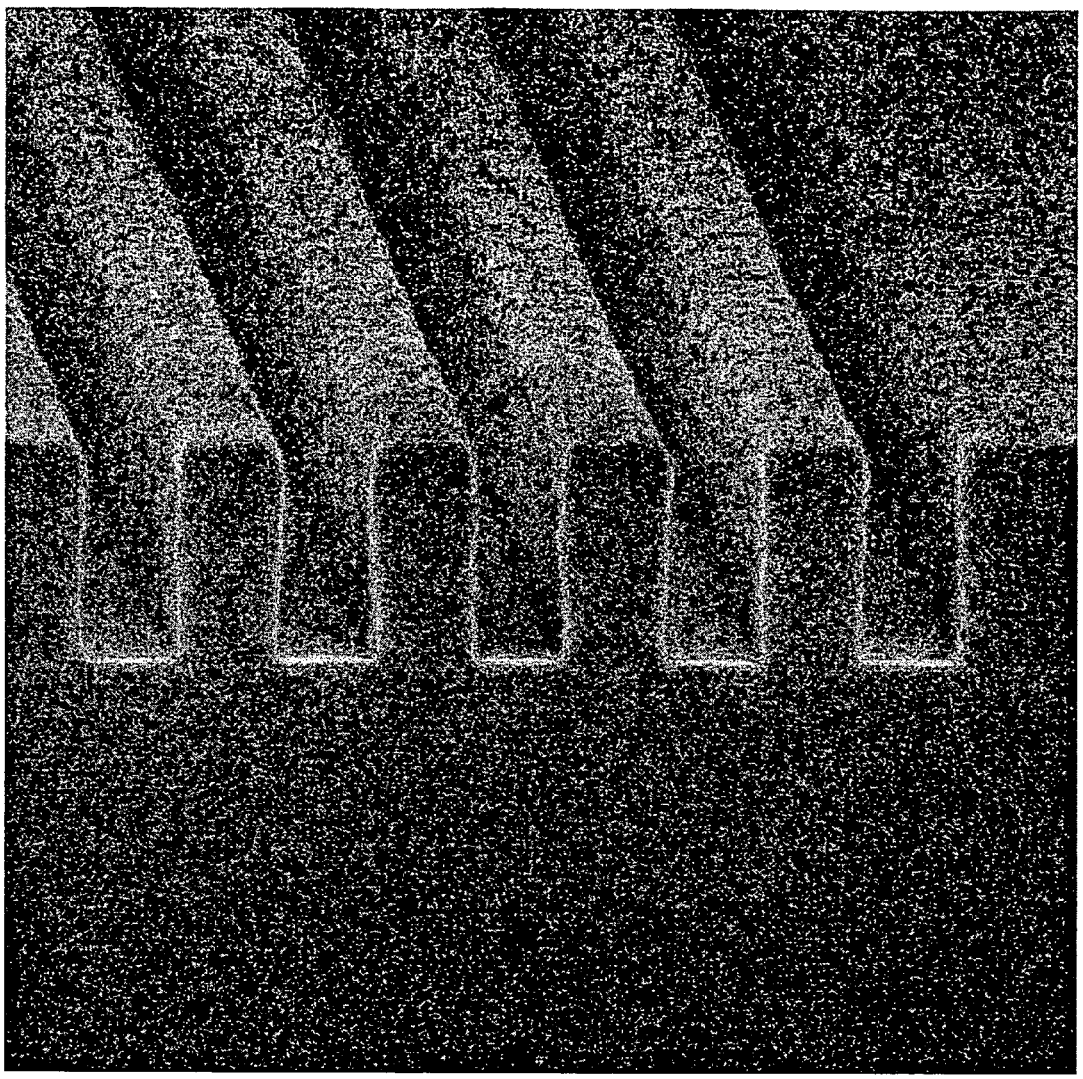
FIG. 1 is a resist pattern having a rectangular profile shown in Examples of the present invention.
Figure 2:
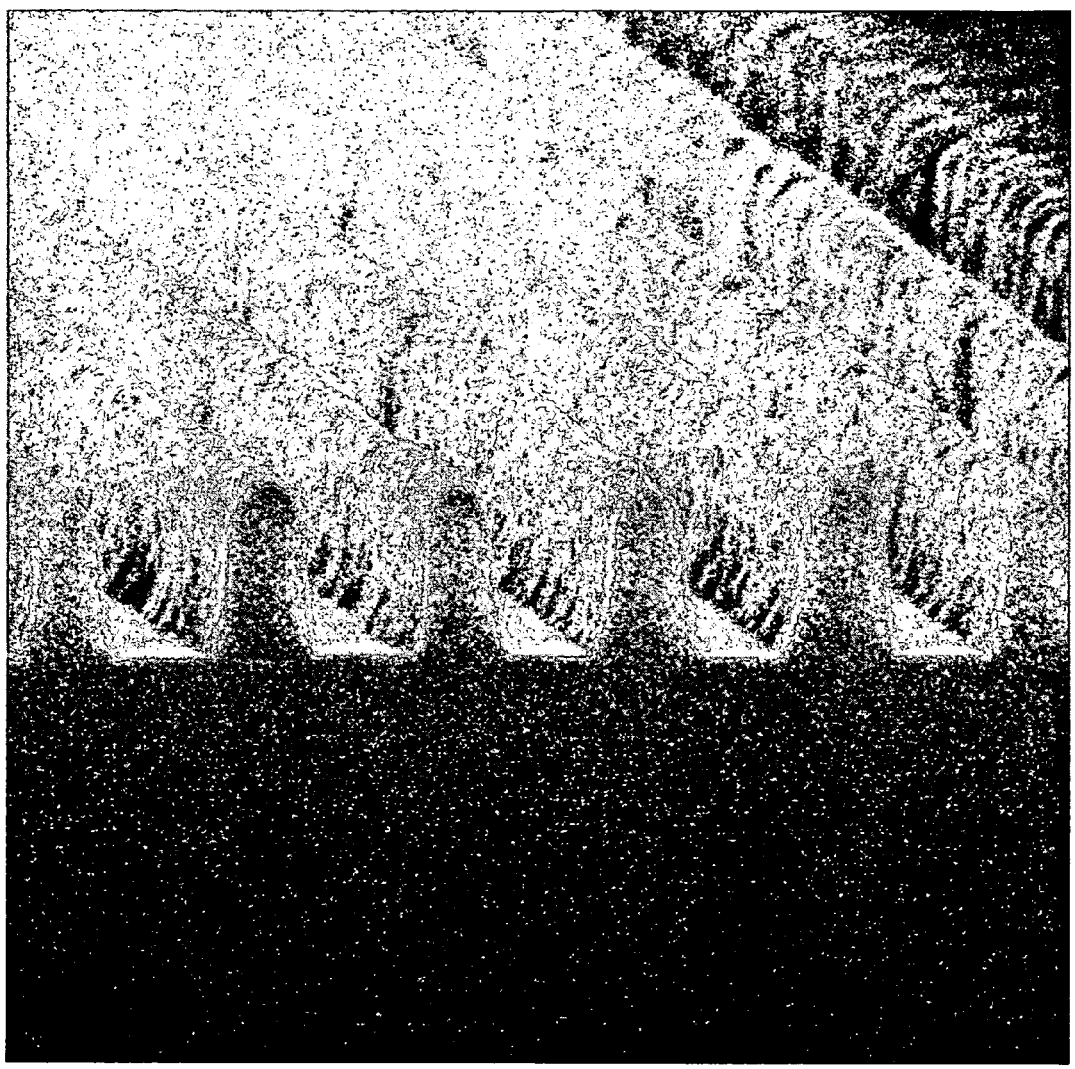
FIG. 2 is an unfavorable resist pattern having a round profile film surface layer shown in Comparative Examples of the present invention.
Figure 3:
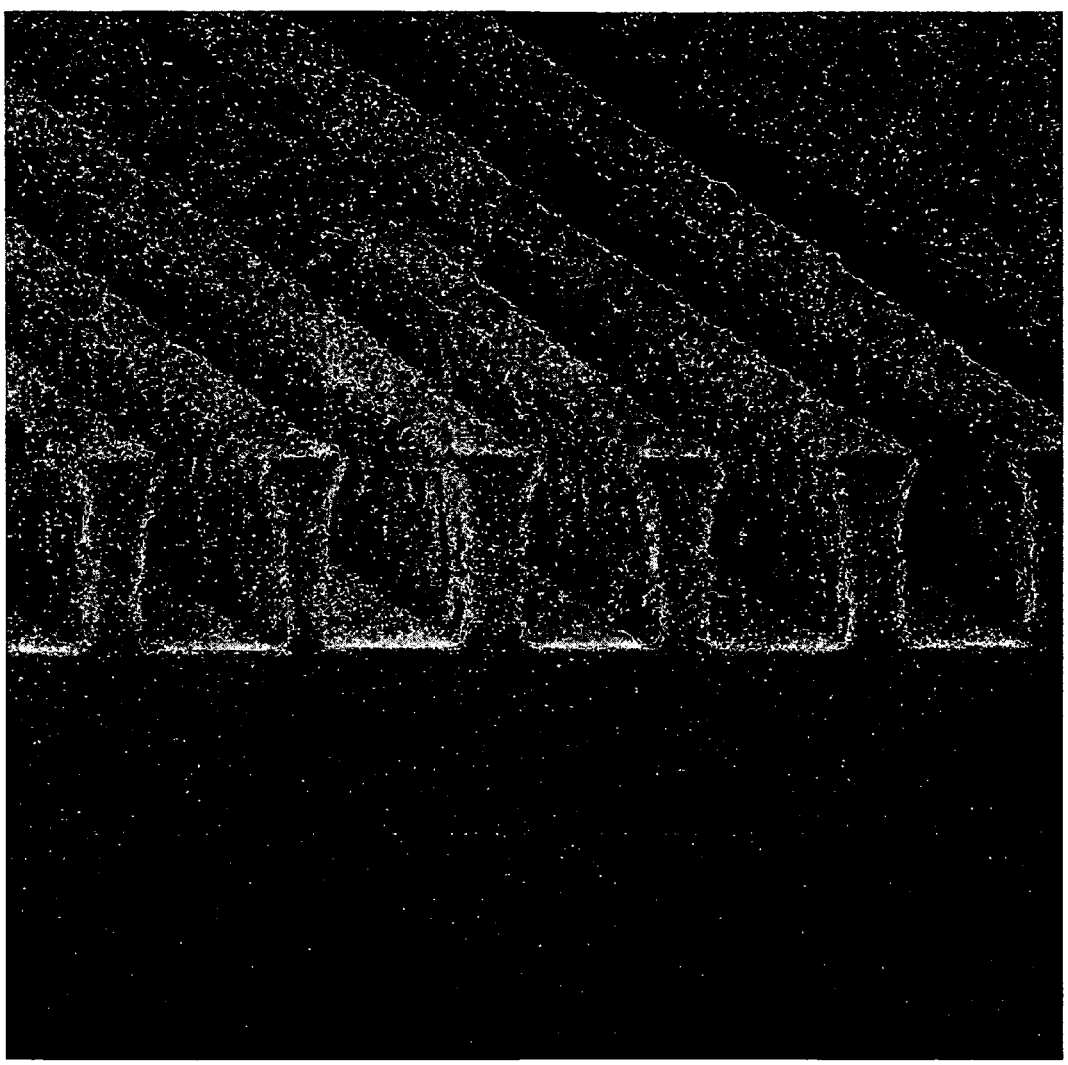
FIG. 3 is another unfavorable resist pattern having a slightly T-Top profile shown in Comparative Examples of the present invention.

In the general formula [2] and the general formula [5], a linear or a branched alkyl group having 1-4 carbon atoms represented by $R_2$ includes, for example, methyl group, ethyl group, n-propyl group, isopropyl group, n-butyl group, isobutyl group, sec-butyl group and tert-butyl group.

In the general formula [3] and the general formula [5], an acid labile group represented by $R_3$ is not particularly limited as long as it is easily eliminated by an action of acid and can form an ester linkage with a carboxylic acid, and specifically includes, for example, a branched or a cyclic tert-alkyl group having 4-10 carbon atoms, such as tert-butyl group, tert-pentyl group and 1-methylcyclohexyl group; an aralkyl group with 9-24 carbon atoms and having a tertiary carbon atom, such as triphenylmethyl group, 1,1-diphenylethyl group and 2-phenyl-2-propyl group; a cyclic acetal group such as tetrahydropyranyl group and tetrahydrofuranyl group; an alicyclic bridged hydrocarbon group having a tertiary carbon atom, such as 1-adamantyl group and 2-methyl-2-adamantyl group; and a lactonyl group such as 4-methyl-2-oxo-4-tetrahydropyranyl group (mevalonic lactonyl group), and among them, tert-butyl group, 1-methylcyclohexyl group, 1-adamantyl group, 2-methyl-2-adamantyl group and 4-methyl-2-oxo-4-tetrahydropyranyl group (mevalonic lactonyl group) are preferable.

In the general formula [5], k, l and m are integers respectively and may be any integer as long as it satisfies the following two equations: $0.25 \geq l/(k+l+m) \geq 0.10$; and $0.20 \geq m/(k+l+m) \geq 0.07$ In the general formula [4], the general formula [6] and the general formula [7], an electron—withdrawing group represented by $R_5$ and $R_7$ includes a halogen atom such as fluorine, chlorine, bromine and iodine; nitro group; sulfo group; carboxy group; and trifluoromethyl group, and among them, halogen atom such as fluorine, chlorine, bromine and iodine; nitro group; and trifluoromethyl group are preferable.

In the general formula [4], the general formula [6] and the general formula [7], a halogen atom represented by $R_4$, $R_6$ and $R_8$ includes fluorine, chlorine, bromine and iodine atoms.

In the general formula [4], the general formula [6] and the general formula [7], specific examples of halogen atoms represented by $R_9$ and $R_{10}$ include the same halogen atoms represented by $R_4$, $R_6$ and $R_8$ and a linear or a branched alkyl group having 1-4 carbon atoms includes, for example, methyl group, ethyl group, n-propyl group, isopropyl group, n-butyl group, isobutyl group, sec-butyl group and tert-butyl group; a linear or a branched alkoxy group having 1-4 carbon atoms includes, for example, methoxy group, ethoxy group, n-propoxy group, isopropoxy group, n-butoxy group, isobutoxy group, sec-butoxy group and tert-butoxy group; a linear or a branched alkoxycarbonyloxy group having 2-5 carbon atoms includes, for example, methoxycarbonyloxy group, ethoxycarbonyloxy group, n-propoxycarbonyloxy group, isopropoxycarbonyloxy group, n-butoxycarbonyloxy group, isobutoxycarbonyloxy group, sec-butoxycarbonyloxy group, and tert-butoxycarbonyloxy group; and a cyclic acetal group having 4-5 carbon atoms includes, for example, tetrahydropyranyloxy group and tetrahydrofuranyloxy group. A preferable group among the above-exemplified $R_9$ and $R_{10}$ includes, each independently, a hydrogen atom or a linear or a branched alkyl group having 1-4 carbon atoms such as methyl group, ethyl group, n-propyl group, isopropyl group, n-butyl group, isobutyl group, sec-butyl group and tert-butyl group.

In the general formula [6], a specific example of a halogen atom, a linear or a branched alkyl group having 1-4 carbon atoms, a linear or a branched alkoxy group having 1-4 carbon atoms, a linear or a branched alkoxycarbonyloxy group having 2-5 carbon atoms and a cyclic acetal group having 4-5 carbon atoms, represented by $R_{10}'$ includes the same one shown by the above $R_{10}$.

A linear or a branched alkyl group having 1-5 carbon atoms as shown in the general formula [12] includes, for example, methyl group, ethyl group, n-propyl group, isopropyl group, n-butyl group, isobutyl group, sec-butyl group, tert-butyl group, n-pentyl group and isopentyl group.

In the general formula [12], a haloalkyl group having 3-8 carbon atoms shown by X includes a halogenated (such as fluorinated, chlorinated, brominated and iodinated) alkyl group having 3-8 carbon atoms. Said alkyl group having 3-8 carbon atoms may be any of linear, branched or cyclic type, and specifically includes, for example, n-propyl group, isopropyl group, n-butyl group, isobutyl group, tert-butyl group, sec-butyl group, n-pentyl group, isopentyl group, tert-pentyl, 1-methylpenytyl group, n-hexyl group, isohexyl group, n-heptyl group, isoheptyl group, n-octyl group, isooctyl group, cyclopropyl group, cyclopentyl group, a cyclohexyl group, a cycloheptyl group and a cyclooctyl group, and a halogenated derivatives thereof specifically includes, 3-chloropropyl group, 3-bromopropyl group, 3,3,3-trifluoropropyl group, 4-chlorobutyl group, 5-chloropentyl group, 6-chlorohexyl group, 7-chloroheptyl group, 8-chlorooctyl group, heptafluoropropyl group, nonafluorobutyl group, undecafluoropentyl group, tridecafluorohexyl group, pentadecafluoroheptyl group, heptadecafluorooctyl group, heptabromopropyl group, nonabromobutyl group, undecabromopentyl group, tridecabromohexyl group, pentadecabromoheptyl group and heptadecabromooctyl group.

In an aryl group optionally having a substitution group as shown by X of the general formula [12], said aryl group is, for example, the one with 6-10 carbon atoms specifically including, for example, phenyl group and naphthyl group, and said substitution group includes, for example, halogen atom, lower haloalkyl group and nitro group. The halogen group here includes, for example, fluorine, chlorine, bromine and iodine atoms. The lower haloalkyl group here includes a halogenated alkyl group with 1-6 carbon atoms and specifically includes, for example, chloromethyl group, bromomethyl group, trifluoromethyl group, 2-chloroethyl group, 3-chloropropyl group, 3-bromopropyl group, 3,3,3-trifluoropropyl group, 4-chlorobutyl group, 5-chloropentyl group and 6-chlorohexyl group.

An acid labile group shown by $R_{11}$ in the general formula [13], any group may be used as long as it is easily eliminated by an action of acid and can form an ether linkage or a carbonate linkage with a phenol group, and includes, for example, tert-butyl group, tert-pentyl group, 1-methylcyclohexyl group, tert-butoxycarbonyl group, trimethylsilyl group and tert-butoxycarbonylmethyl group.

A specific example of the monomer unit shown by the general formula [1] includes, for example, such groups as derived from p-hydroxystyrene and p-hydroxy-α-methylstyrene.

A specific example of the monomer unit represented by the general formula [2] includes, for example, styrene, p-methylstyrene, m-methylstyrene, p-ethylstyrene, p-n-propylstyrene, p-isopropylstyrene, p-n-butylstyrene, p-isobutylstyrene, p-sec-butylstyrene and p-tert-butylstyrene, and preferably such monomers as derived from styrene, p-methylstyrene, m-methylstyrene and p-tert-butylstyrene.

A specific example of the monomer unit represented by the general formula [3] includes, for example, tert-butyl acrylate, tert-pentyl acrylate, 1-methylcyclohexyl acrylate, tetrahydropyranyl acrylate, tetrahydrofuranyl acrylate, 1-adamantyl acrylate, 2-methyl-2-adamantyl acrylate, 4-methyl-2-oxo-4-tetrapyranyl acrylate, triphenylmethyl acrylate, 1,1-diphenylethyl acrylate, 2-phenyl-2-propyl acrylate, tert-butyl methacrylate, tert-pentyl methacrylate, 1-methylcyclohexyl methacrylate, tetrahydropyranyl methacrylate, tetrahydrofuranyl methacrylate, 1-adamantyl methacrylate, 2-methyl-2-adamantyl methacrylate, 4-methyl-2-oxo-4-tetrapyranyl methacrylate, triphenylmethyl methacrylate, 1,1-diphenylethyl methacrylate and 2-phenyl-2-propyl methacrylate, and preferably such monomers as derived from tert-butyl acrylate, 1-methylcyclohexyl acrylate, 1-adamantyl acrylate, 2-methyl-2-adamantyl acrylate, 4-methyl-2-oxo-4-tetrapyranyl acrylate, tert-butyl methacrylate, 1-methylcyclohexyl methacrylate, 1-adamantyl methacrylate, 2-methyl-2-adamantyl methacrylate and 4-methyl-2-oxo-4-tetrapyranyl methacrylate.

A specific example of the polymer represented by the general formula [5] includes, for example, poly(p-hydroxystyrene/styrene/tert-butyl acrylate), poly(p-hydroxystyrene/styrene/tert-pentyl acrylate), poly(p-hydroxystyrene/styrene/1-methylcyclohexyl acrylate), poly(p-hydroxystyrene/styrene/tetrahydropyranyl acrylate), poly(p-hydroxystyrene/styrene/1-adamantyl acrylate), poly(p-hydroxystyrene/styrene/2-methyl-2-adamantyl acrylate), poly(p-hydroxystyrene/styrene/4-methyl-2-oxo-4-tetrapyranyl acrylate), poly(p-hydroxystyrene/styrene/triphenylmethyl acrylate), poly(p-hydroxystyrene/styrene/1,1-diphenylethyl acrylate), poly(p-hydroxystyrene/styrene/2-phenyl-2-propyl acrylate), poly(p-hydroxy-α-methylstyrene/styrene/tert-butyl acrylate), poly(p-hydroxy-α-methylstyrene/styrene/tert-pentyl acrylate), poly(p-hydroxystyrene/styrene/tert-butyl methacrylate), poly(p-hydroxystyrene/styrene/tert-pentyl methacrylate), poly(p-hydroxystyrene/styrene/1-methylcyclohexyl methacrylate), poly(p-hydroxystyrene/styrene/tetrahydropyranyl methacrylate), poly(p-hydroxystyrene/styrene/1-adamantyl methacrylate), poly(p-hydroxystyrene/styrene/2-methyl-2-adamantyl methacrylate), poly(p-hydroxystyrene/styrene/4-methyl-2-oxo-4-tetrapyranyl methacrylate), poly(p-hydroxystyrene/styrene/triphenylmethyl methacrylate), poly(p-hydroxystyrene/styrene/1,1-diphenylethyl methacrylate), poly(p-hydroxystyrene/styrene/2-phenyl-2-propyl methacrylate), poly(p-hydroxy-α-methylstyrene/styrene/tert-butyl methacrylate), poly(p-hydroxy-α-methylstyrene/styrene/tert-pentyl methacrylate), poly(p-hydroxystyrene/p-methylstyrene/tert-butyl acrylate), poly(p-hydroxystyrene/m-methylstyrene/tert-butyl acrylate), poly(p-hydroxystyrene/p-methylstyrene/tert-pentyl acrylate), poly(p-hydroxystyrene/m-methylstyrene/tert-pentyl acrylate), poly(p-hydroxystyrene/p-methylstyrene/1-methylcyclohexyl acrylate), poly(p-hydroxystyrene/m-methylstyrene/1-methylcyclohexyl acrylate), poly(p-hydroxystyrene/p-methylstyrene/tetrahydropyranyl acrylate), poly(p-hydroxystyrene/p-methylstyrene/1-adamantyl acrylate), poly(p-hydroxystyrene/m-methylstyrene/1-adamantyl acrylate), poly(p-hydroxystyrene/p-methylstyrene/2-methyl-2-adamantyl acrylate), poly(p-hydroxystyrene/m-methylstyrene/2-methyl-2-adamantyl acrylate), poly(p-hydroxystyrene/p-methylstyrene/4-methyl-2-oxo-4-tetrapyranyl acrylate), poly(p-hydroxystyrene/p-methylstyrene/4-methyl-2-oxo-4-tetrapyranyl acrylate), poly(p-hydroxystyrene/m-methylstyrene/4-methyl-2-oxo-4-tetrapyranyl acrylate), poly(p-hydroxystyrene/p-methylstyrene/triphenylmethyl acrylate), poly(p-hydroxystyrene/p-methylstyrene/1,1-diphenylethyl acrylate), poly(p-hydroxystyrene/p-methylstyrene/2-phenyl-2-propyl acrylate), poly(p-hydroxy-α-methylstyrene/p-methylstyrene/tert-butyl acrylate), poly(p-hydroxy-α-methylstyrene/p-methylstyrene/tert-pentyl acrylate), poly(p-hydroxystyrene/p-methylstyrene/tert-butyl methacrylate), poly(p-hydroxystyrene/m-methylstyrene/tert-butyl methacrylate), poly(p-hydroxystyrene/p-methylstyrene/tert-pentyl methacrylate), poly(p-hydroxystyrene/m-methylstyrene/tert-pentyl methacrylate), poly(p-hydroxystyrene/p-methylstyrene/1-methylcyclohexyl methacrylate), poly(p-hydroxystyrene/m-methylstyrene/1-methylcyclohexyl methacrylate), poly(p-hydroxystyrene/p-methylstyrene/tetrahydropyranyl methacrylate), poly(p-hydroxystyrene/p-methylstyrene/1-adamantyl methacrylate), poly(p-hydroxystyrene/m-methylstyrene/1-adamantyl methacrylate), poly(p-hydroxystyrene/p-methylstyrene/2-methyl-2-adamantyl methacrylate), poly(p-hydroxystyrene/m-methylstyrene/2-methyl-2-adamantyl methacrylate), poly(p-hydroxystyrene/p-methylstyrene/4-methyl-2-oxo-4-tetrapyranyl methacrylate), poly(p-hydroxystyrene/m-methylstyrene/4-methyl-2-oxo-4-tetrapyranyl methacrylate), poly(p-hydroxystyrene/p-methylstyrene/triphenylmethyl methacrylate), poly(p-hydroxystyrene/p-methylstyrene/1,1-diphenylethyl methacrylate), poly(p-hydroxystyrene/p-methylstyrene/2-phenyl-2-propyl methacrylate), poly(p-hydroxy-α-methylstyrene/p-methylstyrene/tert-butyl methacrylate), poly(p-hydroxy-α-methylstyrene/p-methylstyrene/tert-pentyl methacrylate), poly(p-hydroxystyrene/p-ethylstyrene/tert-butyl acrylate), poly(p-hydroxystyrene/p-ethylstyrene/tert-pentyl acrylate), poly(p-hydroxystyrene/p-ethylstyrene/1-methylcyclohexyl acrylate), poly(p-hydroxystyrene/p-ethylstyrene/1-adamantyl acrylate), poly(p-hydroxystyrene/p-ethylstyrene/2-methyl-2-adamantyl acrylate), poly(p-hydroxystyrene/p-ethylstyrene/4-methyl-2-oxo-4-tetrapyranyl acrylate), poly(p-hydroxy-α-methylstyrene/p-ethylstyrene/tert-butyl acrylate), poly(p-hydroxy-α-methylstyrene p-ethylstyrene/tert-pentyl acrylate), poly(p-hydroxystyrene/p-ethylstyrene/tert-butyl methacrylate), poly(p-hydroxystyrene/p-ethylstyrene/tert-pentyl methacrylate), poly(p-hydroxystyrene/p-ethylstyrene/1-methylcyclohexyl methacrylate), poly(p-hydroxystyrene/p-ethylstyrene/1-adamantyl methacrylate), poly(p-hydroxystyrene/p-ethylstyrene/2-methyl-2-adamantyl methacrylate), poly(p-hydroxystyrene/p-ethylstyrene/4-methyl-2-oxo-4-tetrapyranyl methacrylate), poly(p-hydroxy-α-methylstyrene/p-ethylstyrene/tert-butyl methacrylate), poly(p-hydroxy-α-methylstyrene/p-ethylstyrene/tert-pentyl methacrylate), poly(p-hydroxystyrene/p-n-propylstyrene/tert-butyl acrylate), poly(p-hydroxystyrene/p-n-propylstyrene/tert-pentyl acrylate), poly(p-hydroxystyrene/p-n-propylstyrene/1-methylcyclohexyl acrylate), poly(p-hydroxystyrene/p-n-propylstyrene/1-adamantyl acrylate), poly(p-hydroxystyrene/p-n-propylstyrene/2-methyl-2-adamantyl acrylate), poly(p-hydroxystyrene/p-n-propylstyrene/4-methyl-2-oxo-4-tetrapyranyl acrylate), poly(p-hydroxy-α-methylstyrene/p-n-propylstyrene/tert-butyl acrylate), poly(p-hydroxy-α-methylstyrene/p-n-propylstyrene/tert-pentyl acrylate), poly(p-hydroxystyrene/p-n-propylstyrene/tert-butyl methacrylate), poly(p-hydroxystyrene/p-n-propylstyrene/tert-pentyl methacrylate), poly(p-hydroxystyrene/p-n-propylstyrene/1- methylcyclohexyl methacrylate), poly(p-hydroxystyrene/p-n-propylstyrene/1-adamantyl methacrylate), poly(p-hydroxystyrene/p-n-propylstyrene/2-methyl-2-adamantyl methacrylate), poly(p-hydroxystyrene/p-n-propylstyrene/4-methyl-2-oxo-4-tetrapyranyl methacrylate), poly(p-hydroxy-α-methylstyrene/p-n-propylstyrene/tert-butyl methacrylate), poly(p-hydroxy-α-methylstyrene/p-n-propylstyrene/tert-pentyl methacrylate), poly(p-hydroxystyrene/p-isopropylstyrene/tert-butyl acrylate), poly(p-hydroxystyrene/p-isopropylstyrene/tert-pentyl acrylate), poly(p-hydroxystyrene/p-isopropylstyrene/1-methylcyclohexyl acrylate), poly(p-hydroxystyrene/p-isopropylstyrene/1-adamantyl acrylate), poly(p-hydroxystyrene/p-isopropylstyrene/2-methyl-2-adamantyl acrylate), poly(p-hydroxystyrene/p-isopropylstyrene/4-methyl-2-oxo-4-tetrapyranyl acrylate), poly(p-hydroxy-α-methylstyrene/p-isopropylstyrene/tert-butyl acrylate), poly(p-hydroxy-α-methylstyrene/p-isopropylstyrene/tert-pentyl acrylate), poly(p-hydroxystyrene/p-isopropylstyrene/tert-butyl methacrylate), poly(p-hydroxystyrene/p-isopropylstyrene/tert-pentyl methacrylate), poly(p-hydroxystyrene/p-isopropylstyrene/1-methylcyclohexyl methacrylate), poly(p-hydroxystyrene/p-isopropylstyrene/1-adamantyl methacrylate), poly(p-hydroxystyrene/p-isopropylstyrene/2-methyl-2-adamantyl methacrylate), poly(p-hydroxystyrene/p-isopropylstyrene/4-methyl-2-oxo-4-tetrapyranyl methacrylate), poly(p-hydroxy-α-methylstyrene/p-isopropylstyrene/tert-butyl methacrylate), poly(p-hydroxy-α-methylstyrene/p-isopropylstyrene/tert-pentyl methacrylate), poly(p-hydroxystyrene/p-n-butylstyrene/tert-butyl acrylate), poly(p-hydroxystyrene/p-n-butylstyrene/tert-pentyl acrylate), poly(p-hydroxystyrene/p-n-butylstyrene/1-methylcyclohexyl acrylate), poly(p-hydroxystyrene/p-n-butylstyrene/1-adamantyl acrylate), poly(p-hydroxystyrene/p-n-butylstyrene/2-methyl-2-adamantyl acrylate), poly(p-hydroxystyrene/p-n-butylstyrene/4-methyl-2-oxo-4-tetrapyranyl acrylate), poly(p-hydroxystyrene/p-n-butylstyrene/tert-butyl methacrylate), poly(p-hydroxystyrene/p-n-butylstyrene/tert-pentyl methacrylate), poly(p-hydroxystyrene/p-n-butylstyrene/1-methylcyclohexyl methacrylate), poly(p-hydroxystyrene/p-n-butylstyrene/1-adamantyl methacrylate), poly(p-hydroxystyrene/p-n-butylstyrene/2-methyl-2-adamantyl methacrylate), poly(p-hydroxystyrene/p-n-butylstyrene/4-methyl-2-oxo-4-tetrapyranyl methacrylate), poly(p-hydroxystyrene/p-isobutylstyrene/tert-butyl acrylate), poly(p-hydroxystyrene/p-isobutylstyrene/tert-pentyl acrylate), poly(p-hydroxystyrene/p-isobutylstyrene/1-methylcyclohexyl acrylate), poly(p-hydroxystyrene/p-isobutylstyrene/1-adamantyl acrylate), poly(p-hydroxystyrene/p-isobutylstyrene/2-methyl-2-adamantyl acrylate), poly(p-hydroxystyrene/p-isobutylstyrene/4-methyl-2-oxo-4-tetrapyranyl acrylate), poly(p-hydroxystyrene/p-isobutylstyrene/tert-butyl methacrylate), poly(p-hydroxystyrene/p-isobutylstyrene/tert-pentyl methacrylate), poly(p-hydroxystyrene/p-isobutylstyrene/1-methylcyclohexyl methacrylate), poly(p-hydroxystyrene/p-isobutylstyrene/1-adamantyl methacrylate), poly(p-hydroxystyrene/p-isobutylstyrene/2-methyl-2-adamantyl methacrylate), poly(p-hydroxystyrene/p-isobutylstyrene/4-methyl-2-oxo-4-tetrapyranyl methacrylate), poly(p-hydroxystyrene/p-sec-butylstyrene/tert-butyl acrylate), poly(p-hydroxystyrene/p-sec-butylstyrene/tert-pentyl acrylate), poly(p-hydroxystyrene/p-sec-butylstyrene/1-methylcyclohexyl acrylate), poly(p-hydroxystyrene/p-sec-butylstyrene/1-adamantyl acrylate), poly(p-hydroxystyrene/p-sec-butylstyrene/2-methyl-2-adamantyl acrylate), poly(p-hydroxystyrene/p-sec-butylstyrene/4-methyl-2-oxo-4-tetrapyranyl acrylate), poly(p-hydroxystyrene/p-sec-butylstyrene/tert-butyl methacrylate), poly(p-hydroxystyrene/p-sec-butylstyrene/tert-pentyl methacrylate), poly(p-hydroxystyrene/p-sec-butylstyrene/1-methylcyclohexyl methacrylate), poly(p-hydroxystyrene/p-sec-butylstyrene/1-adamantyl methacrylate), poly(p-hydroxystyrene/p-sec-butylstyrene/2-methyl-2-adamantyl methacrylate), poly(p-hydroxystyrene/p-sec-butylstyrene/4-methyl-2-oxo-4-tetrapyranyl methacrylate), poly(p-hydroxystyrene/p-tert-butylstyrene/tert-butyl acrylate), poly(p-hydroxystyrene/p-tert-butylstyrene/tert-pentyl acrylate), poly(p-hydroxystyrene/p-tert-butylstyrene/1-methylcyclohexyl acrylate), poly(p-hydroxystyrene/p-tert-butylstyrene/1-adamantyl acrylate), poly(p-hydroxystyrene/p-tert-butylstyrene/2-methyl-2-adamantyl acrylate), poly(p-hydroxystyrene/p-tert-butylstyrene/4-methyl-2-oxo-4-tetrapyranyl acrylate), poly(p-hydroxystyrene/p-tert-butylstyrene/triphenylmethyl acrylate), poly(p-hydroxystyrene/p-tert-butylstyrene/1,1-diphenylethyl acrylate), poly(p-hydroxystyrene/p-tert-butylstyrene/2-phenyl-2-propyl acrylate), poly(p-hydroxy-α-methylstyrene/p-tert-butylstyrene/tert-butyl acrylate), poly(p-hydroxy-α-methylstyrene/p-tert-butylstyrene/tert-pentyl acrylate), poly(p-hydroxystyrene/p-tert-butylstyrene/tert-butyl methacrylate), poly(p-hydroxystyrene/p-tert-butylstyrene/tert-pentyl methacrylate), poly(p-hydroxystyrene/p-tert-butylstyrene/1-methylcyclohexyl methacrylate), poly(p-hydroxystyrene p-tert-butylstyrene/1-adamantyl methacrylate), poly(p-hydroxystyrene/p-tert-butylstyrene/2-methyl-2-adamantyl methacrylate), poly(p-hydroxystyrene/p-tert-butylstyrene/4-methyl-2-oxo-4-tetrapyranyl methacrylate), poly(p-hydroxystyrene/p-tert-butylstyrene/triphenylmethyl methacrylate), poly(p-hydroxystyrene/p-tert-butylstyrene/1,1-diphenylethyl methacrylate), poly(p-hydroxystyrene/p-tert-butylstyrene/2-phenyl-2-propyl methacrylate), poly(p-hydroxy-α-methylstyrene/p-tert-butylstyrene/tert-butyl methacrylate) and poly(p-hydroxy-α-methylstyrene/p-tert-butylstyrene/tert-pentyl methacrylate).

In view of high resolution and high etching resistance, preferable polymers among them include, for example, poly(p-hydroxystyrene/styrene/tert-butyl acrylate), poly(p-hydroxystyrene/styrene/1-methylcyclohexyl acrylate), poly(p-hydroxystyrene/styrene/1-adamantyl acrylate), poly(p-hydroxystyrene/styrene/2-methyl-2-adamantyl acrylate), poly(p-hydroxystyrene/styrene/4-methyl-2-oxo-4-tetrapyranyl acrylate), poly(p-hydroxystyrene/p-methylstyrene/tert-butyl acrylate), poly(p-hydroxystyrene/m-methylstyrene/tert-butyl acrylate), poly(p-hydroxystyrene/p-methylstyrene/1-methylcyclohexyl acrylate), poly(p-hydroxystyrene/m-methylstyrene/1-methylcyclohexyl acrylate), poly(p-hydroxystyrene/p-methylstyrene/1-adamantyl acrylate), poly(p-hydroxystyrene/m-methylstyrene/1-adamantyl acrylate), poly(p-hydroxystyrene/p-methylstyrene/2-methyl-2-adamantyl acrylate), poly(p-hydroxystyrene/m-methylstyrene/2-methyl-2-adamantyl acrylate), poly(p-hydroxystyrene/p-methylstyrene/4-methyl-2-oxo-4-tetrapyranyl acrylate), poly(p-hydroxystyrene/m-methylstyrene/4-methyl-2-oxo-4-tetrapyranyl acrylate), poly(p-hydroxystyrene/p-tert-butylstyrene/tert-butyl acrylate), poly(p-hydroxystyrene/p-tert-butylstyrene/1-methylcyclohexyl acrylate), poly(p-hydroxystyrene/p-tert-butylstyrene/1-adamantyl acrylate), poly(p-hydroxystyrene/p-tert-butylstyrene/2-methyl-2-adamantyl acrylate) and poly(p-hydroxystyrene/p-tert-butylstyrene/4-methyl-2-oxo-4-tetrapyranyl acrylate), and more preferable polymers include, for example, poly(p-hydroxystyrene/styrene/tert-butyl acrylate), poly(p-hydroxystyrene/styrene/1-methylcyclohexyl acrylate), poly(p-hydroxystyrene/styrene/1-adamantyl acrylate), poly(p-hydroxystyrene/styrene/2-methyl-2-adamantyl acrylate), poly(p-hydroxystyrene/styrene/4-methyl-2-oxo-4-tetrapyranyl acrylate), poly(p-hydroxystyrene/p-methylstyrene/tert-butyl acrylate), poly (p-hydroxystyrene/p-methylstyrene/1-methylcyclohexyl acrylate), poly(p-hydroxystyrene/p-methylstyrene/1-adamantyl acrylate), poly(p-hydroxystyrene/p-methylstyrene/2-methyl-2-adamantyl acrylate), poly(p-hydroxystyrene/p-methylstyrene/4-methyl-2-oxo-4-tetrapyranyl acrylate), poly(p-hydroxystyrene/m-methylstyrene/tert-butyl acrylate), poly(p-hydroxystyrene/m-methylstyrene/1-methylcyclohexyl acrylate), poly(p-hydroxystyrene/m-methylstyrene/1-adamantyl acrylate), poly(p-hydroxystyrene/m-methylstyrene/2-methyl-2-adamantyl acrylate) and poly(p-hydroxystyrene/m-methylstyrene/4-methyl-2-oxo-4-tetrapyranyl acrylate). These polymers may be used alone or in combination of two or more kinds.

The polymer represented by the general formula [5] is obtained by mixing a vinyl compound monomer which is original of a monomer unit group shown by the general formula [1], a vinyl compound monomer which is original of a monomer unit group shown by a general formula [2] and a vinyl compound monomer for a monomer unit group shown by the general formula [3] so that a ratio of each monomer unit derived from above monomers in the finally obtained polymer is the value as described above, dissolving them in a suitable solvent such as toluene, 1,4-dioxane, tetrahydrofuran, isopropanol and methyl ethyl ketone, in an amount of 1 to 10 times of the monomers in volume, reacting under nitrogen gas flow, at 50 to 150° C. for 1 to 20 hours in the presence of a polymerization initiator such as azobisisobutylonitrile, 2,2'-azobis(2,4-dimethyl-valelonitrile), 2,2'-azobis(methyl 2-methylpropionate), 2,2'-azobis(2-methylbutylonitrile), benzoyl peroxide and lauroyl peroxide, in an amount of 0.1 to 30% by weight based on the monomers, and treating according to the usual method after the reaction.

Weight average molecular weight (Mw) of the polymer represented by the general formula [5] is usually 3,000 to 50,000, preferably 5,000 to 25,000, and more preferably 5,000 to 20,000. Molecular weight distribution (Mw/Mn) of said polymer is usually 1.0 to 3.5 and preferably 1.0 to 2.5.

A specific example of the polymer represented by the general formula [13] includes, for example, poly(p-hydroxystyrene/p-tert-butoxystyrene), poly(p-hydroxystyrene/p-tert-pentyloxystyrene), poly(p-hydroxystyrene/1-methyl-cyclohexyloxystyrene), poly(p-hydroxystyrene/p-tert-butoxycarbonyloxystyrene), poly(p-hydroxystyrene/p-trimethylsilyloxystyrene) and poly(p-hydroxystyrene/p-tert-butoxycarbonylmethoxystyrene), and preferable polymers among them are poly(p-hydroxystyrene/p-tert-butoxystyrene) and poly(p-hydroxystyrene/p-tert-butoxycarbonyloxystyrene). These polymers may be synthesized according to the known methods such as those disclosed in JP-A-4-221258, JP-A-8-123032 and JP-A-10-53621.

Weight average molecular weight (Mw) of the polymer represented by the general formula [13] is usually 3,000 to 50,000, preferably 5,000 to 25,000 and more preferably 5,000 to 20,000. Molecular weight distribution (Mw/Mn) of said polymer is usually 1.0 to 3.5 and preferably 1.0 to 2.5.

The polymer represented by the general formula [13] is used by mixing with the polymer represented by the general formula [5], and a mixing ratio thereof is, as a ratio of the polymer represented by the general formula [5] to the polymer represented by the general formula [13], usually from 95:5 to 60:40 and preferably from 90:10 to 70:30.

When the polymer represented by the general formula [13] is used by mixing with the polymer represented by the general formula [5], the polymer of the general formula [13] may be added in advance in synthesizing the polymer represented by the general formula [5] so that a ratio of both polymers becomes as described above, or the polymer of the general formula [5] prepared and the polymer of the general formula [13] prepared may be mixed in said ratio. The latter is more preferable in view of easiness of preparation.

In the resist composition of the present invention, in addition to said copolymers, a photosensitive compound represented by the general formula [4], which generates an acid by irradiation of radioactive ray (hereinafter, abbreviated as "an acid generator"), is used as a major component. The acid generator represented by the general formula [4] can generate sulfonic acid with strong acidity because of at least one electron-withdrawing group introduced at m(meta)-position of an aromatic ring of counter anion. A preferable example of said counter anion includes, for example, pentafluorobenzenesulfonate, 3-trifluoromethylbenzene-sulfonate and 3,5-di-trifluoromethylbenzenesulfonate.

Said acid generator represented by the general formula [4] is roughly classified into two types: an acid generator represented by the general formula [6] which generates a strong acid and shows an extremely high dissolution inhibiting effect against a developing solution, and an acid generator represented by the general formula [7] which generates a strong acid and shows a dissolution inhibiting effect against a developing solution weaker than the compound represented by the general formula [6] but furnishes high sensitivity. The acid generator represented by the general formula [6] and the acid generator represented by the general formula [7] may be used alone, but combined use of both types of compounds is particularly preferable, because it brings about higher sensitivity and higher resolution as well as superior pattern profile formed when one kind of each type is used in combination.

In the combined use of the acid generator represented by the general formula [6] and the acid generator represented by the general formula [7], a combination may be made with at least one kind of each compound selected from the specific examples of the acid generator represented by the general formula [6] described below and the specific examples of the acid generator represented by the general formula [7] described below, respectively. In this case, a mixing ratio of the acid generator represented by the general formula [6] and the acid generator represented by the general formula [7] is preferably in a range of 2:1 to 1:5 in weight ratio.

A specific example of the acid generator represented by the general formula [6] includes, for example, diphenyl-4-methylphenylsulfonium pentafluorobenzenesulfonate, diphenyl-4-methylphenylsulfonium 2,5-dichlorobenzenesulfonate, diphenyl-4-methylphenylsulfonium 2,4,5-trichlorobenzenesulfonate, diphenyl-4-methylphenylsulfonium 3-nitrobenzenesulfonate, diphenyl-4-methylphenylsulfonium 3,5-dinitrobenzenesulfonate, diphenyl-4-methylphenylsulfonium 3-trifluoromethylbenzenesulfonate, diphenyl-4-methylphenylsulfonium 3,5-di-trifluoromethylbenzenesulfonate, diphenyl-2,4-dimethylphenylsulfonium pentafluorobenzenesulfonate, diphenyl-2,4-dimethylphenylsulfonium 2,5-dichloro-benzenesulfonate, diphenyl-2,4-dimethylphenylsulfonium 2,4,5-trichlorobenzenesulfonate, diphenyl-2,4-dimethylphenylsulfonium 3-nitrobenzenesulfonate, diphenyl-2,4-dimethylphenylsulfonium 3,5-dinitrobenzenesulfonate, diphenyl-2,4-dimethylphenylsulfonium 3-trifluoromethylbenzenesulfonate, diphenyl-2,4-dimethylphenylsulfonium 3,5-di-trifluoromethylbenzenesulfonate, diphenyl-2,4,6-trimethylphenylsulfonium pentafluorobenzenesulfonate, diphenyl-2,4,6-trimethylphenylsulfonium 2,5-dichlorobenzene-sulfonate, diphenyl-2,4,6-trimethylphenylsulfonium 2,4,5-trichlorobenzenesulfonate, diphenyl-2,4,6-trimethylphenylsulfonium 3-nitrobenzenesulfonate, diphenyl-2,4,6-trimethylphenylsulfonium 3,5-dinitrobenzenesulfonate, diphenyl-2,4,6-trimethylphenylsulfonium 3-trifluoromethylbenzenesulfonate, diphenyl-2,4,6-trimethylphenylsulfonium 3,5-di-trifluoromethylbenzenesulfonate, diphenyl-4-ethylphenylsulfonium pentafluorobenzenesulfonate, diphenyl-4-ethylphenylsulfonium 2,5-dichlorobenzenesulfonate, diphenyl-4-ethylphenylsulfonium 3-trifluoromethylrobene-sulfonate, diphenyl-4-ethylphenylsulfonium 3,5-di-trifluoromethylbenzenesulfonate, diphenyl-4-n-propylphenylsulfonium pentafluorobenzene-sulfonate, diphenyl-4-n-propylphenylsulfonium 3-trifluoromethylbenzenesulfonate, diphenyl-4-isopropylphenylsulfonium pentafluorobenzenesulfonate, diphenyl-4-isopropylphenylsulfonium 3-trifluoromethylbenzenesulfonate, diphenyl-4-n-butylphenylsulfonium pentafluorobenzenesulfonate, diphenyl-4-n-butylphenylsulfonium 3-trifluoromethylbenzenesulfonate, diphenyl-4-isobutylphenylsulfonium pentafluorobenzene-sulfonate, diphenyl-4-isobutylphenylsulfonium 3-trifluoromethylbenzenesulfonate, diphenyl-4-sec-butylphenylsulfonium pentafluorobenzenesulfonate, diphenyl-4-sec-butylphenylsulfonium 3-trifluoromethylbenzenesulfonate, diphenyl-4-tert-butylphenylsulfonium pentafluorobenzene-sulfonate, diphenyl-4-tert-butylphenylsulfonium 2,5-dichlorobenzenesulfonate, diphenyl-4-tert-butylphenylsulfonium 2,4,5-trichlorobenzenesulfonate, diphenyl-4-tert-butylphenylsulfonium 3-nitrobenzenesulfonate, diphenyl-4-tert-butylphenylsulfonium 3,5-dinitrobenzenesulfonate, diphenyl-4-tert-butylphenylsulfonium 3-trifluoromethylbenzenesulfonate, diphenyl-4-tert-butylphenylsulfonium 3,5-di-trifluoromethylbenzenesulfonate, tris(4-methylphenyl)sulfonium pentafluorobenzenesulfonate, tris(4-methylphenyl)sulfonium 3-trifluoromethylbenzene-sulfonate, tris(4-methylphenyl)sulfonium 3,5-ditrifluoromethylbenzenesulfonate, tris(4-ethylphenyl)sulfonium pentafluorobenzenesulfonate, tris(4-n-propylphenyl)sulfonium pentafluorobenzenesulfonate, tris(4-isopropylphenyl)sulfonium pentafluorobenzenesulfonate, tris(4-isopropylphenyl)sulfonium 3-trifluoromethylbenzenesulfonate, tris(4-isopropylphenyl)sulfonium 3,5-trifluoromethylbenzene-sulfonate, bis(4-methylphenyl)phenylsulfonium pentafluoro-benzenesulfonate, bis(4-methylphenyl)phenylsulfonium 2,5-dichlorobenzenesulfonate, bis(4-methylphenyl)phenylsulfonium 3-trifluoromethylbenzenesulfonate and bis(4-methylphenyl)phenylsulfonium 3,5-di-trifluoromethyl-benzenesulfonate, and a preferable compound includes diphenyl-2,4,6-trimethylphenylsulfonium pentafluorobenzene-sulfonate, diphenyl-2,4,6-trimethylphenylsulfonium 3-trifluoromethylbenzenesulfonate, diphenyl-2,4,6-trimethylphenylsulfonium 3,5-di-trifluoromethylbenzenesulfonate, diphenyl-2,4,6-trimethylphenylsulfonium 2,5-dichlorobenzenesulfonate, diphenyl-4-methylphenylsulfoniumpentafluorobenzenesulfonate, diphenyl-4-methylphenylsulfonium 3-trifluoromethylbenzene-sulfonate, diphenyl-4-methylphenylsulfonium 3,5-di-trifluoromethylbenzenesulfonate and diphenyl-4-methylphenylsulfonium 2,5-dichlorobenzenesulfonate, and a more preferable compound includes diphenyl-2,4,6-trimethylphenylsulfonium pentafluorobenzenesulfonate, diphenyl-2,4,6-trimethylphenylsulfonium 3-trifluoromethylbenzenesulfonate, diphenyl-2,4,6-trimethylphenylsulfonium 3,5-di-trifluoromethylbenzenesulfonate, diphenyl-4-methylphenylsulfonium pentafluorobenzenesulfonate, diphenyl-4-methylphenylsulfonium 3-trifluoromethylbenzene-sulfonate and diphenyl-4-methylphenylsulfonium 3,5-di-trifluoromethylbenzenesulfonate.

A specific example of the acid generator represented by the general formula [7] includes, for example, triphenylsulfonium pentafluorobenzenesulfonate, triphenylsulfonium 2,5-dichlorobenzenesulfonate, triphenylsulfonium 2,4,5-trichlorobenzenesulfonate, triphenylsulfonium 3-nitrobenzenesulfonate, triphenylsulfonium 3,5-dinitrobenzenesulfonate, triphenylsulfonium 3-trifluoromethylbenzenesulfonate and triphenylsulfonium 3,5-di-trifluoromethylbenzenesulfonate, and preferable compound includes triphenylsulfonium pentafluorobenzenesulfonate, triphenylsulfonium 3-trifluoromethylbenzenesulfonate, triphenylsulfonium 3,5-di-trifluoromethylbenzenesulfonate and triphenylsulfonium 2,5-dichlorobenzenesulfonate, and more preferable compound includes triphenylsulfonium pentafluorobenzenesulfonate, triphenylsulfonium 3-trifluoromethylbenzenesulfonate and triphenylsulfonium 3,5-di-trifluoromethylbenzenesulfonate.

The acid generator represented by the general formula [4] (or the general formula [6] or the general formula [7]) can be synthesized, for example, by the following method:

Namely, a compound represented by the general formula [8]:

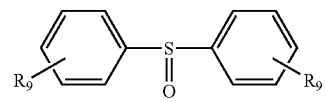

[8]

[wherein, $R_9$ is the same as described above]; is dissolved in a halogenated hydrocarbon solvent such as methylene choloride, methylene bromide, 1,2-dichloroethane and chloroform, or an aromatic hydrocarbon solvent such as benzene, toluene and xylene, or a mixed solvent of these solvents with ethers such as ethyl ether, isopropyl ether, tetrahydrofran and 1,2-dimethoxyethane, then a Grignard reagent represented by the following general formula [9]:

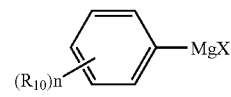

[9]

[wherein, $R_{10}$ and n are the same as described above; and X is a halogen atom]; at −10 to 100° C. in an amount of 0.5 to 3 times by mole of the compound represented by the general formula [8] is added to the obtained solution, followed by reacting at 0 to 100° C. for 0.5 to 10 hours while stirring. After completion of the reaction, the reaction mixture is treated at 0 to 30° C. with an aqueous solution of hydrohalogenic acid solution such as hydrobromic acid, hydrochloric acid and hydroiodic acid, to obtain a compound represented by the following general formula [10]:

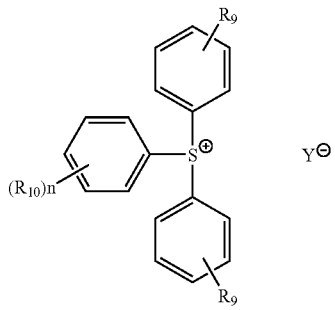

[wherein, $R_9$ and $R_{10}$ are the same as described above; and Y is a halogen atom]. The thus obtained compound is dissolved in a solvent such as methylene chloride, methanol, ethanol, isopropanol, water or a mixed solvent thereof, then 0.9 to 1.5 moles of a salt of an organic sulfonic acid represented by the following general formula [11]:

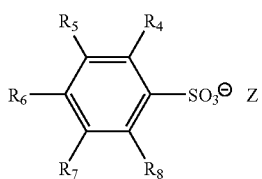

[wherein, $R_4$ to $R_8$ are the same as described above; and Z is a counter cation such as $Ag^+$, $Na^+$, $K^+$, $Li^+$ and tetramethylammonium] is added; followed by reacting at 0 to 50° C. for 0.5 to 20 hours while stirring, to obtain a compound represented by the general formula [4] (or the general formula [6] or the general formula [7]).

A specific example of the compound represented by the general formula [12] includes, for example, diphenyliodonium nonafluorobutanesulfonate, diphenyliodonium heptadecafluorooctanesulfonate, diphenyliodonium pentafluorobenzenesulfonate, diphenyliodonium 2,4-difluorobenzenesulfonate, diphenyl-iodonium 2-fluorobenzenesulfonate, diphenyliodonium 3-fluorobenzenesulfonate, diphenyliodonium 4-fluoro-benzenesulfonate, diphenyliodonium 2,4,5-trichlorobenzene-sulfonate, diphenyliodonium 2,5-dichlorobenzenesulfonate, diphenyliodonium 2-nitrobenzenesulfonate, diphenyliodonium 3-nitrobenzenesulfonate, diphenyliodonium 4-nitrobenzene-sulfonate, diphenyliodonium 3,5-dinitrobenzenesulfonate, diphenyliodonium 2-trifluoromethylbenzenesulfonate, diphenyl-iodonium 3-trifluoromethylbenzenesulfonate, diphenyliodonium 4-trifluoromethylbenzenesulfonate, diphenyliodonium 3,5-di-trifluoromethylbenzenesulfonate, di-4-methylphenyliodonium nonafluorobutanesulfonate, di-4-methylphenyliodonium heptadecafluorooctanesulfonate, di-4-methylphenyliodonium pentafluorobenzenesulfonate, di-4-methylphenyliodonium 2,4-difluorobenzenesulfonate, di-4-methylphenyliodonium 2-fluorobenzenesulfonate, di-4-methylphenyliodonium 3-fluorobenzenesulfonate, di-4-methylphenyliodonium 4-fluorobenzenesulfonate, di-4-methylphenyliodonium 2,4,5-trichlorobenzenesulfonate, di-4-methylphenyliodonium 2,5-dichlorobenzenesulfonate, di-4-methylphenyliodonium 2-nitro-benzenesulfonate, di-4-methylphenyliodonium 3-nitrobenzenesulfonate, di-4-methylphenyliodonium4-nitrobenzenesulfonate, di-4-methylphenyliodonium 3,5-dinitrobenzenesulfonate, di-4-methylphenyliodonium 2-trifluoromethylbenzenesulfonate, di-4-methylphenyliodonium 3-trifluoromethylbenzenesulfonate, di-4-methylphenyliodonium 4-trifluoromethylbenzenesulfonate, di-4-methylphenyliodonium 3,5-di-trifluoromethylbenzene-sulfonate, di-4-ethylphenyliodoniumnonafluorobutanesulfonate, di-4-ethylphenyliodonium heptadecafluorooctanesulfonate, di-4-ethylphenyliodonium pentafluorobenzenesulfonate, di-4-ethylphenyliodonium 2,4-difluorobenzenesulfonate, di-4-ethylphenyliodonium 2-fluorobenzenesulfonate, di-4-ethylphenyliodonium 3-fluorobenzenesulfonate, di-4-ethylphenyliodonium 4-fluorobenzenesulfonate, di-4-ethylphenyliodonium 2,4,5-trichlorobenzenesulfonate, di-4-ethylphenyliodonium 2,5-dichlorobenzenesulfonate, di-4-ethylphenyliodonium 2-nitrobenzenesulfonate, di-4-ethylphenyl-iodonium 3-nitrobenzenesulfonate, di-4-ethylphenyliodonium 4-nitrobenzenesulfonate, di-4-ethylphenyliodonium 3,5-dinitrobenzenesulfonate, di-4-ethylphenyliodonium 2-trifluoromethylbenzenesulfonate, di-4-ethylphenyliodonium 3-trifluoromethylbenzene-sulfonate, di-4-ethylphenyliodonium 4-trifluoromethylbenzenesulfonate, di-4-ethylphenyliodonium 3,5-di-trifluoromethylbenzenesulfonate, di-4-propylphenyl-iodonium nonafluorobutanesulfonate, di-4-propylphenyliodonium heptadecafluorooctanesulfonate, di-4-propylphenyliodonium pentafluorobenzenesulfonate, di-4-propylphenyliodonium 2,4-difluorobenzenesulfonate, di-4-propylphenyliodonium 2-fluorobenzenesulfonate, di-4-propylphenyliodonium 3-fluorobenzenesulfonate, di-4-propylphenyliodonium 4-fluorobenzenesulfonate, di-4-propylphenyliodonium 2,4, 5-trichlorobenzenesulfonate, di-4-propylphenyliodonium 2,5-dichlorobenzenesulfonate, di-4-propylphenyliodonium 2-nitro-benzenesulfonate, di-4-propylphenyliodonium 3-nitrobenzene-sulfonate, di-4-propylphenyliodonium4-nitrobenzenesulfonate, di-4-propylphenyliodonium 3,5-dinitrobenzenesulfonate, di-4-propylphenyliodonium 2-trifluoromethylbenzenesulfonate, di-4-propylphenyliodonium 3-trifluoromethylbenzenesulfonate, di-4-propylphenyliodonium 4-trifluoromethylbenzenesulfonate, di-4-propylphenyliodonium 3,5-di-trifluoromethylbenzenesulfonate, di-4-isopropylphenyliodonium nonafluorobutanesulfonate, di-4-isopropylphenyliodonium heptadecafluorooctanesulfonate, di-4-isopropylphenyliodonium pentafluoro-benzenesulfonate, di-4-isopropylphenyliodonium pentafluoro-benzenesulfonate, di-4-isopropylphenyliodonium 2,4-difluoro-benzenesulfonate, di-4-isopropylphenyliodonium 2-fluoro-benzenesulfonate, di-4-isopropylphenyliodonium 3-fluoro-benzenesulfonate, di-4-isopropylphenyliodonium 4-fluoro-benzenesulfonate, di-4-isopropylphenyliodonium 2,4,5-trichlorobenzenesulfonate, di-4-isopropylphenyliodonium 2,5-dichlorobenzenesulfonate, di-4-isopropylphenyliodonium 2-nitrobenzenesulfonate, di-4-isopropylphenyliodonium 3-nitrobenzenesulfonate, di-4-isopropylphenyliodonium 4-nitrobenzenesulfonate, di-4-isopropylphenyliodonium 3,5-dinitrobenzenesulfonate, di-4-isopropylphenyliodonium 2-trifluoromethylbenzenesulfonate, di-4-isopropylphenyliodonium 3-trifluoromethylbenzenesulfonate, di-4-isopropylphenyliodonium 4-trifluoromethylbenzenesulfonate, di-4-isopropylphenyliodonium 3,5-di-trifluoromethylbenzene-sulfonate, di-4-tert-butylphenyliodonium nonafluorobutane-sulfonate, di-4-tert-butylphenyliodonium heptadecafluorooctanesulfonate, di-4-tert-butylphenyliodonium pentafluorobenzenesulfonate, di-4-tert-butylphenyliodonium 2,4-difluorobenzenesulfonate, di-4-tert-butylphenyliodonium 2-fluorobenzenesulfonate, di-4-tert-butylphenyliodonium 3-fluorobenzenesulfonate, di-4-tert-butylphenyliodonium 4-fluorobenzenesulfonate, di-4-tert-butylphenyliodonium 2,4,5-trichlorobenzenesulfonate, di-4-tert-butylphenyliodonium 2,5-dichlorobenzenesulfonate, di-4-tert-butylphenyliodonium 2-nitrobenzenesulfonate, di-4-tert-butylphenyliodonium 3-nitrobenzenesulfonate, di-4-tert-butylphenyliodonium 4-nitrobenzenesulfonate, di-4-tert-butylphenyliodonium 3,5-dinitrobenzenesulfonate, di-4-tert-butylphenyliodonium 2-trifluoromethylbenzenesulfonate, di-4-tert-butylphenyliodonium 3-trifluoromethylbenzene-sulfonate, di-4-tert-butylphenyliodonium 4-trifluoromethylbenzenesulfonate, di-4-tert-butylphenyliodonium 3,5-di-trifluoromethylbenzene-sulfonate, di-4-tert-pentylphenyliodonium nonafluorobutane-sulfonate, di-4-tert-pentylphenyliodonium heptadecafluorooctanesulfonate, di-4-tert-pentylphenyliodonium pentafluoro-benzenesulfonate, di-4-tert-pentylphenyliodonium 2,4-difluorobenzenesulfonate, di-4-tert-pentylphenyliodonium 2-fluorobenzenesulfonate, di-4-tert-pentylphenyliodonium 3-fluorobenzenesulfonate, di-4-tert-pentylphenyliodonium 4-fluorobenzenesulfonate, di-4-tert-pentylphenyliodonium 2,4,5-trichlorobenzenesulfonate, di-4-tert-pentylphenyl-iodonium 2,5-dichlorobenzenesulfonate, di-4-tert-pentylphenyliodonium 2-nitrobenzenesulfonate, di-4-tert-pentylphenyliodonium 3-nitrobenzenesulfonate, di-4-tert-butylphenyliodonium 4-nitrobenzenesulfonate, di-4-tert-pentylphenyliodonium 3,5-dinitrobenzenesulfonate, di-4-tert-pentylphenyliodonium 2-trifluoromethylbenzenesulfonate, di-4-tert-pentylphenyliodonium 3-trifluoromethylbenzene-sulfonate, di-4-tert-pentylphenyliodonium 4-trifluoromethylbenzenesulfonate, di-4-tert-pentylphenyliodonium 3,5-di-trifluoromethylbenzenesulfonate, and preferable compounds among them are diphenyliodonium nonafluorobutanesulfonate, diphenyliodonium heptadecafluorooctanesulfonate, diphenyliodonium pentafluorobenzenesulfonate, diphenyliodonium 3-trifluoromethylbenzenesulfonate, diphenyl-iodonium 3,5-ditrifluoromethylbenzenesulfonate, di-4-methylphenyliodonium nonafluorobutanesulfonate, di-4-methylphenyl-iodonium heptadecafluorooctanesulfonate, di-4-methylphenyl-iodonium pentafluorobenzenesulfonate, di-4-methylphenyl-iodonium 3-trifluoromethylbenzenesulfonate and di-4-methylphenyliodonium 3,5-di-trifluoromethylbenzenesulfonate.

The acid generator represented by the general formula [12] may be synthesized according to the known methods, for example, as described in Jamaes. V. Crivello; Julia. H. W. Lam, Macromolecules, 1977, 10 (6), 1307-1315; James. V. Crivello; Julia. H. W. Lam, J. Org. Chem., 1978, 43(15), 3055-3058.

The above-described acid generator represented by the general formula [12] may be used in combination with the acid generator represented by the general formula [4] (or the acid generator represented by the general formula [6] and/or [7]) and a ratio is usually 50:1 to 1:5, preferably 10:1 to 1:2.

As a method for mixing the acid generator represented by the general formula [12] with the acid generator represented by the general formula [4] (or the acid generator represented by the general formula [6] and/or [7]), any method may be used as long as the acid generator represented by the general formula [12] and the acid generator represented by the general formula [4] are mixed in the above ratio.

In a resist composition of the present invention, a mixing ratio of polymer component and acid generator is usually 1 to 30% by weight, preferably 1 to 20% by weight of the acid generator to 100% by weight of the polymer.

In a resist composition of the present invention, a solvent, an organic basic compound and optionally an additive such as a surfactant and a dissolution promoter are used in addition to the above-described polymer and the acid generator.

As a solvent used in the present invention, any solvent may be used as long as it can dissolve the polymer, the acid generator, the basic compound and the additive such as a surfactant and a dissolution promoter of the present invention. Usually a solvent having a good property for forming a resist with uniform thickness is used. Such a solvent includes, for example, caboxylate esters such as methyl cellosolve acetate, ethyl cellosolve acetate, propylene glycol monomethyl ether acetate, propylene glycol monoethyl ether acetate, methyl lactate, ethyl lactate, propyl lactate, 2-ethoxyethyl acetate, methyl pyruvate, ethyl pyruvate, methyl 3-methoxypropionate, ethyl 3-methoxypropionate, methyl 3-ethoxypropionate and ethyl 3-ethoxypropionate; ketones such as cyclohexanone, methyl ethyl ketone and 2-heptanone; cyclic eters such as 1,4-dioxane; ethers such as propylene glycol monomethyl ether, diethylene glycol monomethyl ether, diethylene glycol dimethyl ether and ethylene glycol monoisopropyl ether; and cyclic amides such as N-methyl-2-pyrolidone, and among them, propylene glycol monomethyl ether, propylene glycol monomethyl ether acetate, ethyl lactate and ethyl 3-ethoxypropionate are preferable. Further, they may be used alone or in combination of two or more kinds.

Amount of the solvent used in the present invention is usually 3 to 40 parts by weight, preferably 5 to 20 parts by weight per 1 part by weight of the polymer.

The basic organic compound in the present invention is used to adjust sensitivity for better pattern formation and improve shelf life of the resist composition itself, and specifically includes, for example, pyridine compounds such as pyridine, picoline, lutidine and $\alpha$, $\alpha'$, $\alpha''$-tripyridine; tertiary alkylamines such as triethylamine, tri-n-butylamine, tri-n-octylamine, di-octylmethylamine, dicyclohexylmethylamine, dimethyldodecylamine, dimethylhexadecylamine, tribenzylamine and tris [2-(2-methoxyethoxy)ethyl]amine; alicyclic amines such as N-methylpyrrolidine, N-methylpyperidine and 1,4-diazabicyclo[2,2,2]octane; tertiary trialkanolamines such as triethanolamine and truisopropanolamine; tetraalkylammoniumhydroxides such as tetrametylammoniumhydroxide, tetraetylammoniumhydroxide and tetra-n-butylammoniumhydroxide; and vinylpyridine-based polymers such as polyvinylpyridine and poly(vinylpyridine/methyl methacrylate), and among them, $\alpha$, $\alpha'$, $\alpha''$-tripyridine, dioctylmethylamine, dicyclohexylmethylamine, dimethyldodecyl-amine, dimethylhexadecylamine and 1,4-diazabicyclo[2,2,2]octane are preferable. They may be used alone or in combination of two or more kinds.

The surfactant includes nonionic surfactants such as polyethylene glycol distearate, polyethylene glycol dilaurate, polyethylene glycol dilaurate, polyethylene glycol, polypropylene glycol, polyoxyethylenestearyl ether and polyoxyethylene cetyl ether; fluorine containing cationic surfactants, fluorine containing nonionic surfactants, fluorine containing anionic surfactants, cationic surfactants and anionic surfactants. In the present invention, among the above-described surfctants, a surfactant having a good property for forming a resist with uniform thickness is preferable, including, for example, fluorine-containing nonionic surfactants such as Fluorad (trade name of a product from Sumitomo 3M Ltd.), Surflon (trade name of a product from Asahi Glass Co., Ltd.), Unidyne (trade name of a product from Daikin Ind., Ltd.), Megafac (trade name of a product from Dainippon Ink & Chem. Inc.) and Eftop (trade name of a product from Tohkem Products Corp.), polyethylene glycol, polypropylene glycol and polyoxyethylene cetyl ether.

Amount to be used of the basic compound or the surfactant of the present invention is usually 0.000001 to 1% by weight, preferablly 0.00001 to 0.5% by weight based on total weight of the polymer, in any resist composition.

The dissolution promoter optionally used in the resist composition of the present invention includes, for example, N,N-dimethylformamide, N,N-dimethylacetamide, β-propiolactone, β-butylolactone, γ-butylolactone, γ-valerolactone and δ-valerolactone. They may be used alone or in proper combination of two or more kinds.

Amount to be used of the dissolution promoter of the present invention may suitably be selected from the amount usually used in this field.

Radioactive ray used for pattern formation using the resist composition of the present invention includes, electron beam, extreme ultraviolet ray (1 to 30 nm band), X-ray, $F_2$ laser (157 nm), KrF excimer laser (248 nm), ArF excimer laser (193 nm) and i line ray (365 nm), and electron beam, extreme ultraviolet ray and X-ray are preferably used, and electron beam is more preferably used.

Pattern formation using the resist composition of the present invention may be performed, for example, as follows.

Namely, the resist composition of the present invention is coated on a semiconductor substrate such as silicon wafer by rotation coating (spin coating), followed by heat treatment (pre-bake) at 70 to 150° C. for 60 to 120 seconds on a hot plate to form a resist film with a thickness of 0.1 to 1.0 μm. Subsequently, in order to form an objective pattern, radioactive ray such as electron beam is irradiated on said resist film under high vacuum if necessary. After the irradiation, heat treatment (PEB) at 70 to 150° C. for 60 to 120 seconds on a hot plate, development for 30 to 120 seconds with an alkaline solution using a spray method, a paddle method or a dip method, then washing with water are carried out to form a specified resist pattern.

As the alkaline developer, an aqueous alkaline solution may be used, in which at least one kind of alkaline compound such as alkali metal hydroxides, aqueous ammonia, alkylamines, alkanolamines, heterocyclic amines and tetraalkylammonium hydroxides, is dissolved in a concentration of usually 0.01 to 20% by weight, preferable 1 to 5% by weight. Particularly preferable developers are aqueous solutions of tetraalkylammonium hydroxides. To said developer consisting of an aqueous alkaline solution, a water-soluble organic solvent such as methanol and ethanol or a surfactant may optionally be added.

The resist composition of the present invention includes a composition which is composed of at least one kind of polymer (for example a polymer represented by the general formula [5]) having, as components thereof, a monomer unit represented by the general formula [1], a monomer unit represented by the general formula [2] and a monomer unit represented by the general formula [3] with an acid labile group, at least one kind of acid generator represented by the general formula [4] (for example, a mixture of an acid generator represented by the general formula [6] and an acid generator represented by the general formula [7]), a basic compound and a solvent, a composition which contains a polymer represented by the general formula [13] as a polymer component, and further a composition containing an acid generating compound represented by the general formula [12] as a compound to generate an acid by irradiation of radioactive ray. In an area where radioactive ray is irradiated, by an action of acid generated and an action of heating, the acid labile group cleaves to form carboxylic acid, which makes said polymer soluble to alkali and forms a positive resist pattern.

Said polymer has a pendant acid labile group which does not decompose nor cleave without heating even in the presence of acid, and thus has less possibility to cause beam fluctuation due to generation of outgas during electron beam irradiation, compared with a polymer having a pendant acid labile group such as noncyclic acetal group which spontaneously decompose in the presence of acid even in a non-heated state, and thus can form a superior pattern even under high vacuum. Further, by introducing a styrene unit having an aromatic ring with an alkyl group or by introducing a (meth)acrylate ester monomer having a bridged alicyclic hydrocarbon group in an ester residue into the polymer (a polymer represented by the general formula [5]), the problem of insufficient etching resistance, a fault of this type of polymer, can be solved. Furthermore, addition of a polymer represented by the general formula [13] can enlarge an exposure margin in pattern formation and reduce an irregularity of pattern in an irradiated area, thus enabling a highly precise pattern formation.

In addition, an aromatic sulfonium salt is used as said acid generator in order to cleave a carboxylate ester with low energy irradiation (high sensitivity) and minimize volatility and diffusion of the acid, and as a counter anion thereof, at least one electron-withdrawing group (for example, halogen atom, nitro group and trifluoromethyl group) is introduced at m-position of the aromatic ring to generate an aromatic sulfonic acid having particularly strong acidity. Thus, volatility and diffusion of generated acid are reduced, and thereby the problems experienced before such as PED (post exposure delay) are eliminated. Further, as a cation, combined use of a substituted arylsulfonium in which an alkyl group is introduced into the aromatic ring (namely, an acid generator represented by the general formula [6]), which has an extremely high dissolution inhibiting effect against a developer and a pattern collapse prevention effect in a critical resolution region, and non-substituted arylsulfonium (an acid generator represented by the general formula [7]), which has a weak dissolution inhibiting effect but furnishes high sensitivity, can provide high sensitivity and high resolution to the resist composition, along with superior pattern profile. Further, use of diphenyliodonium salt (namely, an acid generator represented by the general formula [12]) which furnishes extremely high sensitivity due to high acid generation efficiency in combination with substituted arylsulfonium in which an alkyl group is intoroduced into the aromatic ring or non-substituted arylsulfonium or combination thereof as described above, enables further high sensitivity of the resist composition. Furthermore, these acid generators have no problem in view of shelf life.

The resist composition of the present invention has, by properly combining the polymer and the acid generator as described above, features coming from both components, that is, a superior pattern formation under high vacuum due to the improved polymer, and a highly precise pattern formation due to enlarged exposure margin (improved exposure latitude), along with high sensitivity and high resolution of the resist composition due to improved acid generator, and is suitable to ultra-fine processing technology in semiconductor element manufacturing and thus a useful resist composition enabling high sensitivity, high resolution and superior pattern profile.

The present invention will be explained further in detail using Synthesis Examples, Examples and Comparative Examples, but the present invention should not be limited by them.

EXAMPLES

Synthesis Example 1

Synthesis of poly(p-hydroxystyrene/styrene/tert-butyl acrylate)

In 400 mL of isopropanol, 84.1 g of p-hydroxystyrene, 20.8 g of styrene and 12.8 g of tert-butyl acrylate were dissolved, then 14.1 g of azobisisobutylonitrile was added and the solution reacted at 80° C. for 6 hours under nitrogen gas flow. After the reaction, said reaction liquid was poured into 10 L of water for precipitation, followed by filtering off deposited crystal, drying under reduced pressure to obtain 95 g of poly(p-hydroxystyrene/styrene/tert-butyl acrylate) as a pale brown powder crystal. The copolymer obtained was named polymer 1. A composition ratio of p-hydroxystyrene unit, styrene unit and tert-butyl acrylate unit in polymer 1 was found to be about 7:2:1 from the measurement results by $^{13}$CNMR. Weight average molecular weight (Mw) of this copolymer was about 10,000 and distribution (Mw/Mn) thereof was about 1.9 from the measurement results by gel permeation chromatography using polystyrene as a standard.

Synthesis Example 2

Synthesis of poly(p-hydroxystyrene/p-methylstyrene/tert-butyl acrylate)

Similar synthesis and post-treatment were performed as in the above described Synthesis Example 1, except that 23.6 g of p-methylstyrene was used instead of styrene, to obtain 96 g of poly(p-hydroxystyrene/p-methylstyrene/tert-butyl acrylate) as a pale brown powder crystal. The copolymer obtained was named polymer 2. A composition ratio of p-hydroxystyrene unit, p-methylstyrene unit and tert-butyl acrylate unit in polymer 2 was found to be about 7:2:1 from the measurement results by $^{13}$CNMR. Weight average molecular weight (Mw) of this copolymer was about 10,500 and distribution (Mw/Mn) thereof was about 1.85 from the measurement results by gel permeation chromatography using polystyrene as a standard.

Synthesis Example 3

Synthesis of poly(p-hydroxystyrene/styrene/1-adamantyl acrylate)

To 400 mL of isopropanol, 87.7 g of p-hydroxystyrene, 18.7 g of styrene and 18.6 g of 1-adamantyl acrylate were dissolved, then 10.0 g of 2,2'-azobis(methyl 2-methylpropionate) (V-601: trade name of a product from Wako Pure Chemicals Ind., Ltd.) was added and the solution reacted at 80° C. for 6 hours under nitrogen gas flow. After the reaction, said reaction liquid was poured into 10 L of water for precipitation, followed by filtering off deposited crystal, drying under reduced pressure, to obtain 100 g of poly(p-hydroxystyrene/styrene/1-adamantyl acrylate) as a pale brown powder crystal. The copolymer obtained was named polymer 3. A composition ratio of p-hydroxystyrene unit, styrene unit and 1-adamantyl acrylate unit in polymer 3 was found to be about 73:18:9 from the measurement results by $^{13}$CNMR. Weight average molecular weight (Mw) of this copolymer was about 9,800 and distribution (Mw/Mn) thereof was about 1.80 from the measurement results by gel permeation chromatography using polystyrene as a standard.

Synthesis Example 4

Synthesis of diphenyl-2,4,6-trimethylphenylsulfonium pentafluorobenzenesulfonate (1) In 600 mL of tetrahydrofran, 24.0 g of diphenylsulfoxide was dissolved under nitrogen atmosphere, then the solution was charged with 31.5 g of chlorotrimethylsilane. To this solution, a Grignard reagent prepared with 60 g of 2-bromomesitylene and 4.70 g of magnesium according to the conventional method was added drop-wise with ice-cooling, followed by reacting at the same temperature for 3 hours. After completion of the reaction, 480 mL of a 24% aqueous hydrobromic acid solution and further 600 mL of toluene was poured drop-wise to said reaction solution and stirred. Then, the organic layer separated was extracted twice with 120 mL of a 12% aqueous hydrobromic acid solution and combined together with the water layer, which was further extracted three times with 480 mL of methylene chloride. The organic layer obtained was dried by anhydrous magnesium sulfate, followed by concentrating under reduced pressure, to obtain 22.0 g of diphenyl-2,4,6-trimethylphenylsulfonium bromide as a white crystal. The measurement results of melting point and NMR of the crystal obtained are shown bellow.

Melting point: 199-200° C. $^1$HNMR(CDCl$_3$) δ ppm: 2.36(6H, s, CH$_3$×2), 2.43(3H, s, CH$_3$), 7.21(2H), 7.69-7.74 (4H, m, Ar—H), 7.75-7.79(6H, m, Ar—H).

(2) In 100 mL of methanol, 19.3 g (0.05 mole) of diphenyl-2,4,6-trimethylphenylsulfonium bromide obtained in the above-described (1) was dissolved, then 20.9 g (0.065 mole) of tetramethylammonium pentafluorobenzenesulfonate was added, followed by reacting at room temperature for 4 hours with stirring. After the reaction, said reaction solution was concentrated and 100 mL of water and 100 mL of methylene chloride were added into the residue, then stirred and left for standing. The organic layer separated was fractionated, followed by washing with water (100 mL×1, 50 mL×1), drying over anhydrous magnesium sulfate, filtering off the drying agent and concentrating under reduced pressure, to obtain 26.8 g of diphenyl-2,4,6-trimethylphenylsulfonium pentafluorobenzenesulfonate as a white crystal. The crystal obtained was named acid generator 1. The measurement results of melting point and NMR of acid generator 1 are shown bellow.

Melting point: 132-133° C. $^1$HNMR(CDCl$_3$) δ ppm: 2.31(6H, s, CH$_3$×2), 2.41(3H, s, CH$_3$), 7.08(2H, s, Ar—H), 7.50-7.51(4H, s, Ar—H), 7.63-7.82(6H, m, Ar—H).

Synthesis Example 5

Synthesis of triphenylsulfonium pentafluorobenzenesulfonate (1) Similar reaction and post-treatment were performed as in Synthesis Example 4 (1), except that 47.3 g of bromobenzene was used instead of 60 g of 2-bromomesitylene, to obtain 20.2 g of triphenylsulfoniumbromide as a white crystal. The measurement results of melting point and NMR of the crystal obtained are shown bellow.

Melting point: 288-290° C. $^1$HNMR(CDCl$_3$) δ ppm: 7.72-7.89(15H, m, Ar—H).

(2) Similar reaction and post-treatment were performed as in Synthesis Example 4 (2), using 17.2 g (0.05 mole) of triphenylsulfoniumbromide obtained in the above-described (1) and 20.9 g (0.065 mole) of tetramethylammonium pentafluorobenzenesulfonate, to obtain 19.1 g of triphenylsulfonium pentafluorobenzenesulfonate as a colorless and viscous and oily substance. The crystal obtained was named acid generator 2. The measurement results of NMR of acid generator 2 are shown bellow.

$^1$HNMR(CDCl$_3$) δ ppm: 7.25-7.80(15H, m, Ar—H).

Synthesis Examples 6 to 11

Various acid generators relevant to the present invention (acid generators 3 to 8) were synthesized in accordance with the procedures in the above-described Synthesis Example 4. Physical properties of each acid generator obtained are shown in Table 1 bellow.

TABLE 1

| Synthesis Example | Compound Name | Appearance, Melting Point | $^1$HNMR(CDCl$_3$) δ ppm |
|---|---|---|---|
| 6 (Acid Generator 3) | Diphenyl-2,4,6-trimethylphenyl-sulfonium 2,5-dichlorobenzene-sulfonate | Slightly yellow, viscous oily substance | 2.30(6H, s, CH$_3$x2), 2.40(3H, s, CH$_3$), 7.13-7.29 (4H, m, Ar-H), 7.62-7.71 (10H, m, Ar-H), 8.02(1H, s, Ar-H) |
| 7 (Acid Generator 4) | Diphenyl-2,4,6-trimethylphenyl-sulfonium 3-trifluoromethyl-benzensulfonate | Colorless, scaly crystal (recrystallized from acetone) | 2.31(6H, s, CH$_3$x2), 2.40(3H, s, CH$_3$), 7.17(2H, s, Ar-H), 7.37-7.39(1H, d, Ar-H), 7.48-7.50(1H, d, Ar-H), 7.62-7.73(10H, m, Ar-H), 8.05-8.07(1H, d, Ar-H), 8.13(1H, s, Ar-H) |
| 8 (Acid Generator 5) | Diphenyl-2,4,6-trimethylphenyl-sulfonium 3-nitro-benzenesulfonate | Slightly yellow, viscous oily substance | 2.33(6H, s, CH$_3$x2), 2.41(3H, s, CH$_3$), 7.19(2H, s, Ar-H), 7.43-7.47(1H, t, Ar-H), 7.63-7.75(10H, m, Ar-H), 8.03-8.10(2H, d, Ar-H), 8.23-8.25(1H, d, Ar-H) 8.64((1H, s, Ar-H)) |
| 9 (Acid Generator 6) | Triphenyl-sulfonium 2,5-dichloro-benzenesulfonate | Slightly yellow, crystal | 7.15(1H, d, Ar-H), 7.27(1H, d, Ar-H), 7.65-7.80(15H, m, Ar-H), 8.11(1H, s, Ar-H) |
| 10 (Acid Generator 7) | Triphenyl-sulfonium 3,5-di-trifluoro-methylbenzene-sulfonate | White crystal 127-128° C. | 7.61-7.69(16H, m, Ar-H), 8.36(2H, s, Ar-H) |
| 11 (Acid Generator 8) | Diphenyl-4-methylphenyl-sulfonium pentafluoro-benzenesulfonate | Colorless, viscous oily substance | 2.47(3H, s, CH$_3$), 7.48-7.50(2H, d, Ar-H), 7.66-7.76(12H, m, Ar-H) |

Synthesis Example 12

Synthesis of poly(p-hydroxystyrene/p-tert-butoxystyrene)

In 400 mL of isopropanol, 56.7 g of p-acetoxystyrene and 26.4 g of p-tert-butoxystyrene were dissolved, then 8.3 g of 2,2'-azobis(methyl 2-methylpropionate) (V-601: trade name of a product from Wako Pure Chemicals Ind., Ltd.) was added, followed by reacting at 80° C. for 6 hours under nitrogen gas flow. After the reaction, said reaction solution obtained was poured into 10 L of water for precipitation, followed by filtering off deposited crystal. The thus obtained crystal was added to 450 mL of methanol, followed by charging 234 g of a 15% aqueous tetramethylammonium hydroxide solution and reacting under reflux for 4 hours while stirring. The thus obtained solution was cooled to room temperature, then neutralized by adding drop-wise 12.9 g of glacial acetic acid. The neutral solution was poured into 10 L of water for precipitation, followed by filtering off deposited crystal and drying under reduced pressure, to obtain 42.6 g of poly(p-hydroxystyrene/p-tert-butoxystyrene) as a white powder crystal. The thus obtained crystal was named polymer A1. A composition ratio of p-hydroxystyrene unit and p-tert-butoxystyrene unit in polymer A1 was found to be about 7:3 from the measurement results by $^{13}$CNMR. Weight average molecular weight (Mw) of polymer A1 was about 9,500 and distribution (Mw/Mn) thereof was about 1.75 from the measurement results by gel permeation chromatography using polystyrene as a standard.

Synthesis Example 13

Synthesis of poly(p-hydroxystyrene/p-tert-butoxycarbonyloxystyrene)

In 250 mL of ethyl acetate, 50.0 g of poly(p-hydroxystyrene) (from Nippon Soda Co., Ltd.; weight average molecular weight (Mw) is about 15,000 and distribution (Mw/Mn) thereof about 1.05) was dissolved, then14.8 g of di-tert-butyl dicarbonate and 11.0 g of pyridine were added and reacted at room temperature for 4 hours. Said reaction solution was then concentrated under reduced pressure, followed by dissolving in 250 mL of acetone, then poured into 3 L of water for precipitation. The thus deposited crystal was filtered off and dried under reduced pressure to obtain 50.8 g of poly(p-hydroxystyrene/p-tert-butoxycarbonyloxystyrene) as a white powder crystal. The thus obtained crystal was named polymer A2. A composition ratio of p-hydroxystyrene unit and p-tert-butoxycarbonyloxystyrene unit in polymer A2 was found to be about 85:15 from the measurement results by $^{13}$CNMR. Weight average molecular weight (Mw) of polymer A2 was about 16,500 and distribution (Mw/Mn) thereof was about 1.05 from the measurement results by gel permeation chromatography using polystyrene as a standard.

Synthesis Example 14

Synthesis of diphenyliodonium nonafluorobutanesulfonate

To 100 ml of methanol, 3.61 g (0.01 mole) of diphenyliodonium bromide and 1.62 g (0.007 mole) of silver oxide were suspended, then the mixture was reacted at room temperature for 2 hours. To the reaction solution, 4.2 g (0.014 mole) of nonafluorobutanesulfonic acid was added drop-wise at room temperature, followed by reacting at the same temperature for 2 hours while stirring. The thus obtained reaction mixture was filtered and concentrated under reduced pressure, followed by purifying 6.4 g of the residue by column chromatography [Wako gel, C-200; eluent of methylene chloride/methanol=9/1 (v/v)], to obtain 4.6 g of diphenyliodonium nonafluorobutanesulfonate as a colorless crystal. The thus obtained crystal was named acid generator B1. The measurement results of melting point and NMR of acid generator B1 are shown bellow.

Melting point: 85-86° C. $^1$HNMR(DMSO-d$_6$) δ ppm: 7.43-7.47(4H, t, Ar—H), 7.59-7.63(2H, t, Ar—H), 7.98-8.00 (4H, t, Ar—H).

Synthesis Example 15

Synthesis of di-p-tolyliodonium nonafluorobutanesulfonate (1) A mixture of 68.4 g (0.67 mole) of acetic anhydride and 33.2 g (0.36 mole) of toluene was cooled to 5° C. or lower, then 32.1 g (0.15 mole) of pottasium iodate was added. To the thus obtained mixed solution, a solution prepared by mixing drop-wise 38.5 g (0.39 mole) of concentrated sulfuric acid to 34.2 g (0.33 mole) of acetic anhydride at 20° C. or lower, was added at −5 to 5° C. over 3 hours. The thus obtained reaction solution was stirred at 0 to 5° C. for 30 minutes, and reacted with stirring at 20 to 25° C. for 4 hours. Then, said reaction solution was left for standing overnight at room temperature, and 112.5 ml of water drop-wise was added while stirring at 25° C. or lower. Said reaction solution was washed with isopropyl ether (35 ml×2), and charged with 25 ml of isopropanol, then an aqueous sodium bromide solution (NaBr 15.4 g/H$_2$O 37.5 ml) was added with drop-wise at room temperature, and the solution was stirred at room temperature for 30 minutes, followed by filtering off deposited crystal, washing with water (60 ml×1), washing with isopropanol (25 ml×1) and drying under reduced pressure, to obtain 33.4 g of di-p-tolyliodonium bromide as a pale yellow powder crystal. The measurement results of NMR of the crystal obtained are shown bellow.

$^1$HNMR(DMSO-d$_6$) δ ppm: 2.33(6H, s, CH$_3$), 7.13-7.15 (4H, d, Ar—H), 7.83-7.85(4H, d, Ar—H).

(2) To 150 ml of methanol, 5.85 g (0.015 mole) of di-p-tolyliodonium bromide obtained in the above-described (1) and 2.43 g (0.0105 mole) of silver oxide were suspended, and the mixture was stirred at room temperature for 2 hours. To the suspension obtained was then charged with 6.3 g (0.021 mole) of nonafluorobutanesulfonic acid, and stirred at room temperature for 2 hours. After the reaction, said reaction mixture was filtered and concentrated under reduced pressure, followed by purifying 11.5 g of the residue by column chromatography [Wako gel, C-200; eluent of methylene chloride/methanol=9/1(v/v)], to obtain 5.4 g of di-p-tolyliodonium nonafluorobutanesulfonate as a pale yellow powder crystal. The thus obtained crystal was named acid generator B2. The measurement results of melting point and NMR of acid generator B2 are shown bellow.

Melting point: 104-105° C. $^1$HNMR(DMSO-d$_6$) δ ppm: 2.39(6H, s, CH$_3$×2), 7.25-7.26(4H, d, Ar—H), 7.83-7.85 (4H, d, Ar—H).

Synthesis Example 16

Synthesis of diphenyliodonium pentafluorobutanesulfonate

To 40 ml of water, 3.8 g (0.012 mole) of diphenyliodonium chloride was suspended, then further 4.8 g (0.015 mole) of tetramethylammonium pentafluorobutane-sulfonate and 8 ml of chloroform ware added and the solution was stirred at room temperature for 4 hours. After stirring for 4 hours, 35 ml of methanol was charged to the suspension obtained, and stirred at room temperature for 1 hour. To the reaction mixture obtained, 30 ml of chloroform was added, and the mixture was stirred and left for standing. Then, the organic layer was fractionated, washed with water (50 ml×6) and concentrated under reduced pressure. The residue was purified by column chromatography [Wako gel, C-200; eluent of methylene chloride/methanol=9/1(v/v)], to obtain 1.0 g of diphenyl pentafluorobenzenesulfonate as a pale yellow crystal. The thus obtained crystal was named acid generator B3. The measurement results of melting point and NMR of acid generator B3 are shown bellow.

Melting point: 163-170° C. $^1$HNMR(DMSO-d$_6$) δ ppm: 7.51-7.55(4H, t, Ar—H), 7.65-7.67(2H, d, Ar—H), 8.23-8.25(4H, t, Ar—H).

Synthesis Example 17

Synthesis of di-p-tolyliodonium pentafluorobenzenesulfonate

To 110 ml of methanol, 4.3 g (0.011 mole) of di-p-tolyliodonium bromide obtained in Synthesis Example 15 (1) and 1.78 g (0.008 mole) of silver oxide were suspended, and the mixture was reacted at room temperature for 2 hours while stirring. To the suspension obtained, a solid, which is obtained by dissolving 4.8 g (0.015 mole) of tetramethylammonium pentafluorobutanesulfonate in 100 ml of water followed by adding 3.0 g (0.03 mole) of concentrated hydrochloric acid and concentrating under reduced pressure, was added, and the suspension was reacted at room temperature for 2 hours while stirring. The reaction mixture was then stirred, and concentrated under reduced pressure. To the residue, 100 ml of methylene chloride and 100 ml of water was added, followed by stirring for 1 hour. After an insoluble substance was filtered off, the mixture was left for standing, followed by fractioning the organic layer, washing with water (50 ml×4) and concentrating under reduced pressure. The thus obtained dark brown oily residue (4.2 g) was purified by column chromatography [Wako gel, C-200; eluent of methylene chloride/methanol=9/1(v/v)], to obtain 2.9 g of di-p-tolyliodonium pentafluorobenzenesulfonate as a pale yellow crystal. The thus obtained crystal was named acid generator B4. The measurement results of melting point and NMR of acid generator B4 are shown bellow.

Melting point: 125-135° C. $^1$HNMR(DMSO-d$_6$) δ ppm: 2.36(6H, s, CH$_3$×2), 7.17-7.19(4H, d, Ar—H), 7.84-7.86 (4H, d, Ar—H).

Example 1

A resist composition consisting of the following components was prepared.

TABLE 2

| Composition | Weight |
| --- | --- |
| Poly(p-hydroxystyrene/styrene/tert-butyl acrylate) (Polymer 1) | 6.0 g |
| Diphenyl-2,4,6-trimethylphenylsulfonium pentafluorobenzenesulfonate (Acid Generator 1) | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed as follows.

The resist composition was filtered with a 0.1 μm size of membrane filter, followed by spin coating on a silicon substrate and pre-baking on a hot plate at 130° C. for 90 seconds, to obtain resist film with a thickness of 0.3 μm. A pattern was drawn using an EB direct writing equipment (acceleration voltage of 50 keV) by irradiating under high vacuum, followed by baking on a hot plate at 120° C. for 60 seconds, developing with a 2.38% aqueous tetramethylammonium hydroxide solution, washing with water to form a resist pattern having a resolution of 100 nm L&S (0.1 μm L&S) with sensitivity of 6.2 μC/cm$^2$. A pattern profile thereof was nearly rectangular. Exposure latitude for 100 nm L&S was 6%.

Example 2

A resist composition consisting of the following components was prepared.

TABLE 3

| Composition | Weight |
| --- | --- |
| Poly(p-hydroxystyrene/styrene/tert-butyl acrylate) (Polymer 1) | 6.0 g |
| Triphenylsulfonium pentafluorobenzenesulfonate (Acid Generator 2) | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 100 nm L&S (0.1 μm L&S) with sensitivity of 4.0 μC/cm$^2$. The pattern had a slightly round profile at the film surface part. Exposure latitude for 100 nm L&S was 5%.

Example 3

A resist composition consisting of the following components was prepared.

TABLE 4

| Composition | Weight |
| --- | --- |
| Poly(p-hydroxystyrene/styrene/tert-butyl acrylate) (Polymer 1) | 6.0 g |

TABLE 4-continued

| Composition | Weight |
| --- | --- |
| Diphenyl-2,4,6-trimethylphenylsulfonium 2,5-dichlorobenzenesulfonate (Acid Generator 3) | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 100 nm L&S with sensitivity of 7.2 μC/cm$^2$. The pattern had a nearly rectangular profile.

Example 4

A resist composition consisting of the following components was prepared.

TABLE 5

| Composition | Weight |
| --- | --- |
| Poly(p-hydroxystyrene/styrene/tert-butyl acrylate) (Polymer 1) | 6.0 g |
| Diphenyl-2,4,6-trimethylphenylsulfonium 3-trifluoromethylbenzenesulfonate (Acid Generator 4) | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 100 nm L&S with sensitivity of 7.2 μC/cm$^2$. The pattern had a nearly rectangular profile.

Example 5

A resist composition consisting of the following components was prepared.

TABLE 6

| Composition | Weight |
| --- | --- |
| Poly(p-hydroxystyrene/styrene/tert-butyl acrylate) (Polymer 1) | 6.0 g |
| Diphenyl-2,4,6-trimethylphenylsulfonium 3-nitrobenzenesulfonate (Acid Generator 5) | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 100 nm L&S with sensitivity of 7.2 μC/cm$^2$. The pattern had a nearly rectangular profile.

Example 6

A resist composition consisting of the following components was prepared.

TABLE 7

| Composition | Weight |
| --- | --- |
| Poly(p-hydroxystyrene/styrene/tert-butyl acrylate) (Polymer 1) | 6.0 g |
| Triphenylsulfonium 2,5-dichlorobenzenesulfonate (Acid Generator 6) | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 110 nm L&S with sensitivity of 3.2 $\mu C/cm^2$. The pattern had a slightly round profile at the top.

Example 7

A resist composition consisting of the following components was prepared.

TABLE 8

| Composition | Weight |
| --- | --- |
| Poly(p-hydroxystyrene/styrene/tert-butyl acrylate) (Polymer 1) | 6.0 g |
| Triphenylsulfonium 3,5-di-trifluoromethylbenzenesulfonate (Acid Generator 7) | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 100 nm L&S with sensitivity of 4.2 $\mu C/cm^2$. The pattern had a nearly rectangular profile.

Example 8

A resist composition consisting of the following components was prepared.

TABLE 9

| Composition | Weight |
| --- | --- |
| Poly(p-hydroxystyrene/styrene/tert-butyl acrylate) (Polymer 1) | 6.0 g |
| Diphenyl-2,4,6-trimethylphenylsulfonium pentafluorobenzenesulfonate (Acid Generator 1) | 0.1 g |
| Triphenylsulfonium pentafluorobenzenesulfonate (Acid Generator 2) | 0.2 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 80 nm L&S with sensitivity of 5.2 $\mu C/cm^2$. The pattern had a nearly rectangular profile. Exposure latitude for 100 nm L&S was 8%.

Example 9

A resist composition consisting of the following components was prepared.

TABLE 10

| Composition | Weight |
| --- | --- |
| Poly(p-hydroxystyrene/p-methylstyrene/tert-butyl acrylate) (Polymer 1) | 6.0 g |
| Diphenyl-2,4,6-trimethylphenylsulfonium pentafluorobenzenesulfonate (Acid Generator 1) | 0.1 g |
| Triphenylsulfonium pentafluorobenzenesulfonate (Acid Generator 2) | 0.2 g |
| Dicyclohexylmethylamine | 0.02 g |
| Fluorine-containing nonionic surfactant [on the market] | 0.1 g |
| Propyleneglycol monomethylether acetate | 40.0 g |
| Propyleneglycol monomethylether | 20.0 g |

Using the above-described resist composition, a pattern was formed similarly as in Example 1. The resist pattern obtained had resolution of 80 nm L&S with sensitivity of 5.0 $\mu C/cm^2$. The pattern had a nearly rectangular profile.

Example 10

A resist composition consisting of the following components was prepared.

TABLE 11

| Composition | Weight |
| --- | --- |
| Poly(p-hydroxystyrene/styrene/1-adamantyl acrylate) (Polymer 1) | 6.0 g |
| Diphenyl-2,4,6-trimethylphenylsulfonium pentafluorobenzenesulfonate (Acid Generator 1) | 0.1 g |
| Triphenylsulfonium pentafluorobenzenesulfonate (Acid Generator 2) | 0.2 g |
| Dicyclohexylmethylamine | 0.02 g |
| Fluorine-containing nonionic surfactant [on the market] | 0.1 g |
| Propyleneglycol monomethylether acetate | 40.0 g |
| Propyleneglycol monomethylether | 20.0 g |

Using the above-described resist composition, a pattern was formed similarly as in Example 1. The resist pattern obtained had resolution of 80 nm L&S with sensitivity of 5.5 $\mu C/cm^2$. The pattern had a nearly rectangular profile.

Example 11

A resist composition consisting of the following components was prepared.

TABLE 12

| Composition | Weight |
| --- | --- |
| Poly(p-hydroxystyrene/styrene/tert-butyl acrylate) (Polymer 1) | 6.0 g |
| Diphenyl-4-methylphenylsulfonium pentafluorobenzenesulfonate (Acid Generator 8) | 0.3 g |
| α,α',α''-Tripyridine | 0.005 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 100 nm L&S with sensitivity of 7.4 µC/cm². The pattern had a nearly rectangular profile. Exposure latitude for 100 nm L&S was 8%.

Example 12

A resist composition consisting of the following components was prepared.

TABLE 13

| Composition | Weight |
| --- | --- |
| Poly(p-hydroxystyrene/styrene/tert-butyl acrylate) (Polymer 1) | 6.0 g |
| Diphenyl-4-methylphenylsulfonium Pentafluorobenzenesulfonate (Acid Generator 8) | 0.15 g |
| Triphenylsulfonium 2,5-dichlorobenzenesulfonate (Acid Generator 6) | 0.15 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 80 nm L&S with sensitivity of 5.8 µC/cm². The pattern had a nearly rectangular profile.

Example 13

A resist composition consisting of the following components was prepared.

TABLE 14

| Composition | Weight |
| --- | --- |
| Poly(p-hydroxystyrene/styrene/tert-butyl acrylate) (Polymer 1) | 6.0 g |
| Diphenyl-4-methylphenylsulfonium Pentafluorobenzenesulfonate (Acid Generator 8) | 0.15 g |
| Triphenylsulfonium 3,5-di-trifluoromethylbenzenesulfonate (Acid Generator 7) | 0.15 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 80 nm L&S with sensitivity of 5.2 µC/cm². The pattern had a nearly rectangular profile.

Example 14

A resist composition consisting of the following components was prepared.

TABLE 15

| Composition | Weight |
| --- | --- |
| Poly(p-hydroxystyrene/p-methylstyrene/tert-butyl acrylate) (Polymer 2) | 6.0 g |
| Diphenyl-2,4,6-trimethylphenylsulfonium 3-trifluoromethylbenzenesulfonate (Acid Generator 4) | 0.1 g |
| Triphenylsulfonium pentafluorobenzenesulfonate (Acid Generator 2) | 0.2 g |

TABLE 15-continued

| Composition | Weight |
| --- | --- |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 80 nm L&S with sensitivity of 5.0 µC/cm². The pattern had a nearly rectangular profile.

Example 15

A resist composition consisting of the following components were prepared.

TABLE 16

| Composition | Weight |
| --- | --- |
| Poly(p-hydroxystyrene/styrene/tert-butyl acrylate) (Polymer 1) | 6.0 g |
| Diphenyl-2,4,6-trimethylphenylsulfonium Pentafluorobenzenesulfonate (Acid Generator 1) | 0.2 g |
| Diphenyliodonium nonafluorobutanesulfonate (Acid Generator B1) | 0.1 g |
| Cyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 100 nm L&S (0.1 µm L&S) with sensitivity of 3.0 µC/cm². The pattern had a nearly rectangular profile. That is, in this Example, improvement in sensitivity was found compared with the results in Example 1 (6.2 µC/cm²) where acid generator B1 (an iodonium salt) was not added. Exposure latitude for 100 nm L&S was 7%.

Example 16

A resist composition consisting of the following components was prepared.

TABLE 17

| Composition | Weight |
| --- | --- |
| Poly(p-hydroxystyrene/styrene/tert-butyl acrylate) (Polymer 1) | 6.0 g |
| Triphenylsulfonium 3,5-di-trifluoromethylbenzenesulfonate (Acid Generator 7) | 0.2 g |
| Di-p-toryliodonium nonafluorobutanesulfonate (Acid Generator B2) | 0.1 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 100 nm L&S (0.1 µm L&S) with sensitivity of 2.2 µC/cm². The pattern had a nearly rectangular profile. Exposure latitude for 100 nm L&S was 9%. That is, in this Example, improvement in sensitivity was found compared with the results in Example 7 (4.2 µC/cm²) where acid generator B2 (an iodonium salt) was not added.

Example 17

A resist composition consisting of the following components was prepared.

TABLE 18

| Composition | Weight |
| --- | --- |
| Poly(p-hydroxystyrene/styrene/tert-butyl acrylate) (Polymer 1) | 6.0 g |
| Diphenyl-2,4,6-trimethylphenylsulfonium pentafluorobenzenesulfonate (Acid Generator 1) | 0.1 g |
| Triphenylsulfonium pentafluorobenzenesulfonate (Acid Generator 2) | 0.1 g |
| Diphenyliodonium pentafluorobenzenesulfonate (Acid Generator B3) | 0.1 g |
| Cyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 80 nm L&S (0.08 μm L&S) with sensitivity of 2.8 μC/cm². The pattern had a nearly rectangular profile. That is, in this Example, improvement in sensitivity was found compared with the results in Example 8 (5.2 μC/cm²), where acid generator B3 (an iodonium salt) was not added. Exposure latitude for 100 nm L&S was 7%.

Example 18

A resist composition consisting of the following components was prepared.

TABLE 19

| Composition | Weight |
| --- | --- |
| Poly(p-hydroxystyrene/styrene/tert-butyl acrylate) (Polymer 1) | 5.0 g |
| Poly(p-hydroxystyrene/p-tert-butoxy-styrene) (Polymer A1) | 1.0 g |
| Diphenyl-2,4,6-trimethylphenylsulfonium Pentafluorobenzenesulfonate (Acid Generator 1) | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 100 nm L&S (0.1 μm L&S) with sensitivity of 6.4 μC/cm². The pattern had a nearly rectangular profile. Exposure latitude for 100 nm L&S was 17%. That is, in this Example, improvement in exposure latitude was found compared with the results in Example 1 (6%) where polymer A1 was not added.

Example 19

A resist composition consisting of the following components was prepared.

TABLE 20

| Composition | Weight |
| --- | --- |
| Poly(p-hydroxystyrene/styrene/tert-butyl acrylate) (Polymer 1) | 5.0 g |
| Poly(p-hydroxystyrene/p-tert-butoxystyrene) (Polymer A1) | 1.0 g |
| Triphenylsulfonium pentafluorobenzenesulfonate (Acid Generator 2) | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 100 nm L&S (0.1 μm L&S) with sensitivity of 4.6 μC/cm². The pattern had a nearly rectangular profile. Exposure latitude at 100 nm L&S was 17%. That is, in this Example, widening of exposure latitude was found compared with the results in Example 2 (5%) where polymer A1 was not added.

Example 20

A resist composition consisting of the following components was prepared.

TABLE 21

| Composition | Weight |
| --- | --- |
| Poly(p-hydroxystyrene/styrene/tert-butyl acrylate) (Polymer 1) | 5.0 g |
| Poly(p-hydroxystyrene/p-tert-butoxycarbonyloxy-styrene) (Polymer A2) | 1.0 g |
| Diphenyl-2,4,6-trimethylphenylsulfonium pentafluorobenzenesulfonate (Acid Generator 1) | 0.2 g |
| Triphenylsulfonium pentafluorobenzenesulfonate (Acid Generator 2) | 0.1 g |
| Dicyclohexylmethylamine | 0.01 g |
| Fluorine-containing nonionic surfactant [on the market] | 0.1 g |
| Ethyl lactate | 60.0 g |

Using the above-described resist composition, a pattern was formed similarly as in Example 1. The resist pattern obtained had resolution of 80 nm L&S (0.08 μm L&S) with sensitivity of 5.6 μC/cm². The pattern had a nearly rectangular profile. Exposure latitude for 100 nm L&S was 18%. That is, in this Example, widening of exposure latitude was found compared with the results in Example 8 (8%) where polymer A2 was not added.

Example 21

A resist composition consisting of the following components was prepared.

TABLE 22

| Composition | Weight |
| --- | --- |
| Poly(p-hydroxystyrene/styrene/tert-butyl acrylate) (Polymer 1) | 5.0 g |
| Poly(p-hydroxystyrene/p-tert-butoxystyrene) (Polymer A1) | 1.0 g |
| Diphenyl-4-methylphenylsulfonium pentafluoro-Benzenesulfonate (Acid Generator 8) | 0.2 g |
| Diphenyliodonium nonafluorobutanesulfonate (Acid Generator B1) | 0.1 g |
| Fluorine-containing nonionic surfactant [on the market] | 0.1 g |

TABLE 22-continued

| Composition | Weight |
| --- | --- |
| Dicyclohexylmethylamine | 0.01 g |
| Propyleneglycol monomethylether acetate | 60.0 g |

Using the above-described resist composition, a pattern was formed similarly as in Example 1. The resist pattern obtained had resolution of 100 nm L&S (0.1 µm L&S) with sensitivity of 2.4 µC/cm². The pattern had a nearly rectangular profile. Exposure latitude for 100 nm L&S was 17%. That is, in this Example, improvements in sensitivity and exposure latitude were found compared with the results in Example 11 (sensitivity: 7.4 µC/cm², exposure latitude 8%) where polymer A1 and acid generator B1 (an iodonium salt) were not added.

Example 22

A resist composition consisting of the following components was prepared.

TABLE 23

| Composition | Weight |
| --- | --- |
| Poly(p-hydroxystyrene/styrene/tert-butyl acrylate) (Polymer 1) | 6.0 g |
| Poly(p-hydroxystyrene/p-tert-butoxycarbonyloxystyrene) (Polymer A2) | 1.0 g |
| Triphenylsulfonium pentafluorobenzenesulfonate (Acid Generator 2) | 0.2 g |
| Di-p-toryliodonium pentafluorobenzenesulfonate (Acid Generator B4) | 0.1 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 100 nm L&S (0.1 µm L&S) with sensitivity of 2.2 µC/cm². The pattern had a nearly rectangular profile. Exposure latitude for 100 nm L&S was 18%. That is, in this Example, improvements in sensitivity and exposure latitude were found compared with the results in Example 2 (sensitivity: 4.0 µC/cm², exposure latitude 5%) where polymer A2 and acid generator B4 (an iodonium salt) were not added.

Example 23

A resist composition consisting of the following components was prepared.

TABLE 24

| Composition | Weight |
| --- | --- |
| Poly(p-hydroxystyrene/styrene/tert-butyl acrylate) (Polymer 1) | 5.0 g |
| Poly(p-hydroxystyrene/p-tert-butoxycarbonyloxystyrene) (Polymer A2) | 1.0 g |
| Diphenyl-2,4,6-trimethylphenylsulfonium pentafluorobenzenesulfonate (Acid Generator 1) | 0.1 g |
| Triphenylsulfonium pentafluorobenzenesulfonate (Acid Generator 2) | 0.1 g |
| Diphenyliodonium nonafluorobutanesulfonate (Acid Generator B1) | 0.1 g |
| Dicyclohexylmethylamine | 0.01 g |

TABLE 24-continued

| Composition | Weight |
| --- | --- |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained had resolution of 80 nm L&S (0.08 µm L&S) with sensitivity of 3.0 µC/cm². The pattern had a nearly rectangular profile. Exposure latitude for 100 nm L&S was 20%. That is, in this Example, improvement in exposure latitude was found compared with the results in Example 17 (exposure latitude 7%) where polymer A2 was not added.

Example 24

A resist composition consisting of the following components was prepared.

TABLE 25

| Composition | Weight |
| --- | --- |
| Poly(p-hydroxystyrene/styrene/tert-butyl acrylate) (Polymer 1) | 5.0 g |
| Poly(p-hydroxystyrene/p-tert-butoxycarbonyloxystyrene) (Polymer A2) | 1.0 g |
| Diphenyl-2,4,6-trimethylphenylsulfonium pentafluorobenzenesulfonate (Acid Generator 1) | 0.1 g |
| Triphenylsulfonium pentafluorobenzenesulfonate (Acid Generator 2) | 0.1 g |
| Di-p-toryliodonium nonafluorobutanesulfonate (Acid Generator B2) | 0.1 g |
| Dicyclohexylmethylamine | 0.01 g |
| Fluorine-containing nonionic surfactant [on the market] | 0.1 g |
| Ethyl lactate | 60.0 g |

Using the above-described resist composition, a pattern was formed similarly as in Example 1. The resist pattern obtained had resolution of 80 nm L&S (0.08 µm L&S) with sensitivity of 3.4 µC/cm². The pattern had a nearly rectangular profile. Exposure latitude for 100 nm L&S was 18%. That is, in this Example, sensitivity, resolution and exposure latitude were found to be equivalent compared with the results in Example 23 where propylene glycol monomethyl ether acetate was used as a solvent. That means that use of ethyl lactate can also provide a resist composition having high sensitivity, high resolution and wide exposure latitude.

Comparative Example 1

A resist composition consisting of the following components was prepared. Various sulfonium salts used in the following Comparative Examples 1 to 16 were synthesized in accordance with the similar method as in the above-described Synthesis Example 4.

TABLE 26

| Composition | Weight |
| --- | --- |
| Poly(p-hydroxystyrene/styrene/tert-butyl acrylate) | 6.0 g |
| Triphenylsulfonium trifluoromethanesulfonate | 0.3 g |
| Dicyclohexylmethylamine | 0.01 g |

TABLE 26-continued

| Composition | Weight |
|---|---|
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained showed poor performances having resolution of only 150 nm L&S with sensitivity of 2.2 µC/cm². The pattern was not good with a significantly round profile at the film surface layer.

Comparative Example 2

A resist composition consisting of the following components was prepared.

TABLE 27

| Composition | Weight |
|---|---|
| Poly(p-hydroxystyrene/styrene/tert-butyl acrylate) | 6.0 g |
| Triphenylsulfonium p-toluenesulfonate | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained showed poor performances even not having resolution of only 150 nm L&S and having sensitivity of 8.8 µC/cm². The pattern was not good with a tapered profile.

Comparative Example 3

A resist composition consisting of the following components was prepared.

TABLE 28

| Composition | Weight |
|---|---|
| Poly(p-hydroxystyrene/styrene/tert-butyl acrylate) | 6.0 g |
| Diphenyl-4-methylphenylsulfonium trifluoromethanesulfonate | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained showed poor performances having resolution of only 150 nm L&S with sensitivity of 3.2 µC/cm². The pattern was not good with strong tailing.

Comparative Example 4

A resist composition consisting of the following components was prepared.

TABLE 29

| Composition | Weight |
|---|---|
| Poly(p-hydroxystyrene/styrene/tert-butyl acrylate) | 6.0 g |
| Diphenyl-2,4,6-trimethylphenylsulfonium p-toluenesulfonate | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained showed poor performances having sensitivity of 13.8 µC/cm² and could not resolve 150 nm L&S. The pattern was not good with a tapered profile.

Comparative Example 5

A resist composition consisting of the following components was prepared.

TABLE 30

| Composition | Weight |
|---|---|
| Poly(p-hydroxystyrene/styrene/tert-butyl acrylate) | 6.0 g |
| Triphenylsulfonium perfluorobutanesulfonate | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained showed poor performances having resolution of only 120 nm L&S with sensitivity of 3.4 µC/cm². The pattern had significantly round profile at the top.

Comparative Example 6

A resist composition consisting of the following components was prepared.

TABLE 31

| Composition | Weight |
|---|---|
| Poly(p-hydroxystyrene/styrene/tert-butyl acrylate) | 6.0 g |
| Triphenylsulfonium perfluorooctanesulfonate | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained showed poor performances having resolution of only 120 nm L&S with sensitivity of 5.0 µC/cm². The pattern had significantly round profile at the top.

Comparative Example 7

A resist composition consisting of the following components was prepared.

TABLE 32

| Composition | Weight |
| --- | --- |
| Poly(p-hydroxystyrene/styrene/tert-butyl acrylate) | 6.0 g |
| Diphenyl-4-tert-butylphenylsulfonium perfluorooctanesulfonate | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained showed poor performances having resolution of only 120 nm L&S with sensitivity of 8.4 $\mu C/cm^2$. The pattern was not good with a T-top profile.

Comparative Example 8

A resist composition consisting of the following components was prepared.

TABLE 33

| Composition | Weight |
| --- | --- |
| Poly(p-hydroxystyrene/styrene/tert-butyl acrylate) | 6.0 g |
| Diphenyl-2,4,6-trimethylphenylsulfonium 4-chlorobenzenesulfonate | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained showed poor performance having resolution of only 150 nm L&S with sensitivity of 9.0 $\mu C/cm^2$. The pattern was not good with a round profile at the top.

Comparative Example 9

A resist composition consisting of the following components was prepared.

TABLE 34

| Composition | Weight |
| --- | --- |
| Poly(p-hydroxystyrene/styrene/tert-butyl acrylate) | 6.0 g |
| Diphenyl-2,4,6-trimethylphenylsulfonium 4-trifluoromethylbenzenesulfonate | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained showed poor performances having resolution of only 120 nm L&S with sensitivity of 8.2 $\mu C/cm^2$. The pattern was not good with a round profile at the top.

Comparative Example 10

A resist composition consisting of the following components was prepared.

TABLE 35

| Composition | Weight |
| --- | --- |
| Poly(p-hydroxystyrene/styrene/tert-butyl acrylate) | 6.0 g |
| Diphenyl-2,4,6-trimethylphenylsulfonium 2-trifluoromethylbenzenesulfonate | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained showed poor performance having resolution of only 120 nm L&S with sensitivity of 9.2 $\mu C/cm^2$. The pattern was not good with a round profile at the top.

Comparative Example 11

A resist composition consisting of the following components was prepared.

TABLE 36

| Composition | Weight |
| --- | --- |
| Poly(p-hydroxystyrene/styrene/tert-butyl acrylate) | 6.0 g |
| Diphenyl-4-methylphenylsulfonium perfluorooctanesulfonate | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained showed poor performance having resolution of only 120 nm L&S with sensitivity of 9.2 $\mu C/cm^2$. The pattern was not good with a round profile at the top.

Comparative Example 12

A resist composition consisting of the following components was prepared.

TABLE 37

| Composition | Weight |
| --- | --- |
| Poly(p-hydroxystyrene/p-tert-butoxycarbonyloxystyrene) [composition ratio = 67/33; Mw 20,500; Mw/Mn 1.10] | 6.0 g |
| Diphenyl-2,4,6-trimethylphenylsulfonium pentafluorobenzenesulfonate | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained showed poor performances having resolution of only 120 nm L&S with sensitivity of 4.4 $\mu C/cm^2$. The pattern was not good with a slightly T-top profile.

Comparative Example 13

A resist composition consisting of the following components was prepared.

TABLE 38

| Composition | Weight |
| --- | --- |
| Poly(p-hydroxystyrene/p-tert-butoxystyrene) [composition ratio = 65/35; Mw 20,300; Mw/Mn 1.10] | 6.0 g |
| Diphenyl-2,4,6-trimethylphenylsulfonium pentafluorobenzenesulfonate | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained showed poor performances having resolution of only 120 nm L&S with sensitivity of 3.6 $\mu C/cm^2$. The pattern was not good with a slightly T-top profile.

Comparative Example 14

A resist composition consisting of the following components was prepared.

TABLE 39

| Composition | Weight |
| --- | --- |
| Poly(p-1-ethoxyethoxystyrene/p-hydroxystyrene/p-tert-butoxystyrene) [composition ratio = 24/66/10; Mw 20,500; Mw/Mn 1.10] | 6.0 g |
| Diphenyl-2,4,6-trimethylphenylsulfonium pentafluorobenzenesulfonate | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained showed poor performances having resolution of only 120 nm L&S with sensitivity of 5.4 $\mu C/cm^2$. The pattern was not good having a nearly rectangular profile but significantly side wall roughness.

Comparative Example 15

A resist composition consisting of the following components was prepared.

TABLE 40

| Composition | Weight |
| --- | --- |
| Poly(p-hydroxystyrene/styrene/tert-butyl acrylate) | 6.0 g |
| Di-(p-tert-butylphenyl)iodonium perfluorobutanesulfonate | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained showed poor performances having resolution of only 130 nm L&S with sensitivity of 4.5 $\mu C/cm^2$. The pattern was not good with a round profile at the top.

Comparative Example 16

A resist composition consisting of the following components was prepared.

TABLE 41

| Composition | Weight |
| --- | --- |
| Poly(p-hydroxystyrene/styrene/tert-butyl acrylate) | 6.0 g |
| N-trifluoromethaneslfonyloxy-5-norbornene-2,3-dicarboxyimide | 0.3 g |
| Dicyclohexylmethylamine | 0.01 g |
| Fluorine-containing nonionic surfactant [on the market] | 0.1 g |
| Propyleneglycol monomethylether acetate | 60.0 g |

Using the above-described resist composition, a pattern was formed similarly as in Example 1. The resist pattern obtained showed poor performances having resolution of only 130 nm L&S with sensitivity of 6.5 $\mu C/cm^2$. The pattern was not good with a round profile at the top. The pattern was also not good with a significantly Side wall roughness.

The results of Comparative Examples 1, 3, 5, 6 and 12 to 16, when compared with the results of Examples 1 to 24, were found to show poorer pattern with unfavorable profiles and more rough side walls and far lower resolution, although sensitivities were high in an equivalent level. The results of Comparative Examples 2, 4 and 7 to 11 showed inferior sensitivity, resolution and profile compared with those of the present invention. It was confirmed that the resist composition comprising combination of the polymer and the acid generator in accordance with the present invention could provide pattern formation with higher sensitivity and resolution than the conventional compositions.

As shown in Examples 18 to 24, use of the resist composition to which both of the polymer represented by the general formula [5] and the polymer represented by the general formula [13] are added, as a polymer in accordance with the present invention, was found to provide improved exposure latitude by about 10% than that to which only any one of said polymers is added.

Furthermore, it was also confirmed that Examples 8 to 10, 12 to 14, 17, 20, 23 and 24 wherein both of the acid generators represented by the general formula [6] and [7] are used, provided resist compositions with higher resolution than those in Examples 1 to 7, 11, 15, 16, 18, 19, 21 and 22 wherein only one of the acid generator represented by either the general formula [6] or [7] was used.

As shown in Examples 15 to 17 and 21 to 24, it was also confirmed that use of a mixture of the acid generators represented by the general formula [12] provided extremely high sensitivity.

Furthermore, as shown in Examples 23 and 24, it was also confirmed that combined use of the polymers represented by the general formulae [5] and [13], along with a mixture of the acid generators represented by the general formulae [6], [7] and [12] could provide improved exposure latitude and higher sensitivity and resolution. That is, it was found that combined use of these polymers and acid generators could provide a resist composition having each feature of component. In addition, it was found that these effects were maintained even when a different solvent was used.

INDUSTRIAL APPLICABILITY

A resist composition of the present invention can provide superior resolution performance with highly precise resolution and superior pattern profile due to having high sensitivity to various radioactive rays represented by electron beam and small amount of outgasing on energy irradiation under high vacuum. Therefore, the present invention contributes to ultra-fine pattern formation in semiconductor manufacturing where further finer devices will be required in the future.

What is claimed is:

1. A resist composition comprising:
at least one kind of polymer represented by the following general formula [5]:

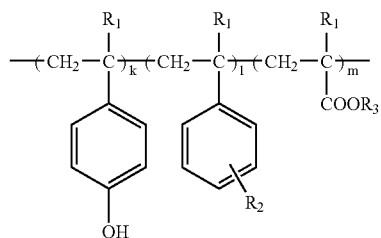

[wherein, $R_1$ is a hydrogen atom or methyl group; $R_2$ is a hydrogen atom or a linear or a branched alkyl group, and $R_3$ is an acid labile group which can be easily eliminated by an action of acid and bonded to bonded to a carboxylic acid to form an ester linkage; k, l and m are integers (with a proviso of $0.25 \geq l/(k+l+m) \geq 0.10$; and $0.20 \geq m/(k+l+m) \geq 0.07$)];

a mixture of at least one kind of compound represented by the following general formula [6]:

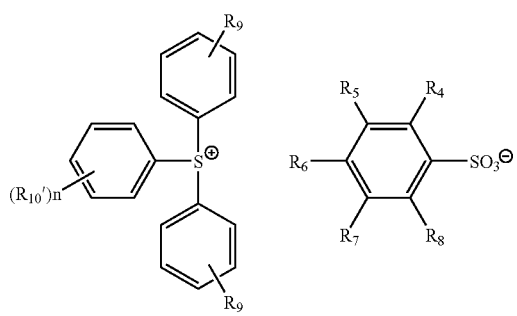

[wherein, each of $R_6$ and $R_7$ is independently a hydrogen atom or an electron-withdrawing group (with a proviso of excluding the case when both of $R_6$ and $R_7$ are simultaneously hydrogen atoms); each of $R_4$, $R_6$ and $R_8$ is independently a hydrogen atom or a halogen atom; $R_9$ is a hydrogen atom, a halogen atom a linear or a branched alkyl group having 1-4 carbon atoms, a linear or a branched alkoxy group having 1-4 carbon atoms, a linear or a branched alkoxycarbonyloxy group having 2-5 carbon atoms cyclic acetal group having 4-5 carbon atoms, and n is an integer of 1-3; and $R_{10}'$ is a halogen atom, a linear or branched alkyl group having 1-4 carbon atoms; a linear or a branched alkoxy group having 1-4 carbon atoms; a linear or a branched alkoxycarbonyloxy group having 2-5 carbon atoms or a cyclic acetal group having 4-5 carbon atoms] and at least one kind of compound represented by the following general formula [7]:

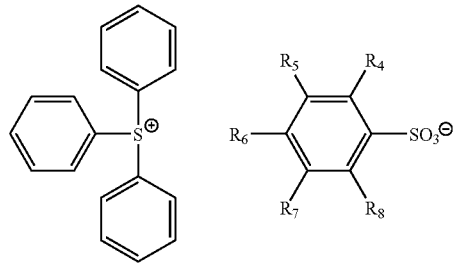

[wherein, $R_4$, $R_5$, $R_6$, $R_7$ and $R_8$ described above];

an organic basic compound; and a solvent.

2. The resist composition in accordance with claim 1, wherein a ratio by weight of said compound to generate an acid by irradiation of radioactive ray represented by the general formula [6] to said compound to generate an acid by irradiation of radioactive ray represented by the general formula [7] is in a range of 2:1 to 1:5.

3. The resist composition in accordance with claim 1, wherein said compound of the general formula [6] is diphenyl-2,4,6-trimethylphenylsulfonium pentafluorobenzenesulfonate, diphenyl-2,4,6-trimethylphenylsulfonium 3-trifluoromethylbenzenesulfonate, diphenyl-2,4,6-trimethylphenylsulfonium 3,5-di-trifluoromethylbenzenesulfonate, diphenyl-4-methylphenylsulfonium pentafluorobenzenesulfonate, diphenyl-4-methylphenylsulfonium 3-trifluoromethylbenzenesulfonate or diphenyl-4-methylphenylsulfonium 3,5-di-trifluoromethylbenzenesulfonate, and said compound of the general formula [7] is triphenylsulfonium pentafluorobenzenesulfonate, triphenylsulfonium 3-trifluoromethylbenzenesulfonate or triphenylsulfonium 3,5-di-trifluoromethylbenzenesulfonate.

4. The resist composition in accordance with claim 1, wherein at least one kind of compound represented by the following general formula [12]:

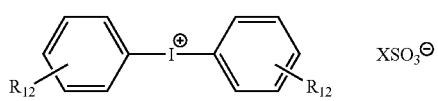

[wherein, $R_{12}$ is independently a hydrogen atom or a linear or a branched alkyl group having 1-5 carbon atoms; and X is a haloalkyl group having 3-8 carbon atoms or an aryl group optionally having a substitution group selected from a halogen atom, a lower haloalkyl group and a nitro group] is further added as a compound to generate an acid by irradiation of radioactive ray.

5. The resist composition in accordance with claim 4, wherein a ratio by weight of said compound to generate an acid by irradiation of radioactive ray represented by the general formula [6] to said compound to generate an acid by irradiation of radioactive ray represented by the general formula [7] is in a range of 2:1 to 1:5, and a ratio by weight of total weight of said compound to generate an acid by irradiation of radioactive ray represented by the general formula [6] and said compound to generate an acid by irradiation of radioactive ray represented by the general formula [7] to said compound to generate an acid by irradiation of radioactive ray represented by the general formula [12] is in a range of 50:1 to 1:5.

6. The resist composition in accordance with claim 4, wherein said compound of the general formula [6] is diphenyl-2,4,6-trimethylphenylsulfonium pentafluorobenzenesulfonate, diphenyl-2,4,6-trimethylphenylsulfonium 3-trifluoromethylbenzenesulfonate, diphenyl-2,4,6-trimethylphenylsulfonium 3,5-di-trifluoromethylbenzenesulfonate, diphenyl-4-methylphenylsulfonium pentafluorobenzenesulfonate, diphenyl-4-methylphenylsulfonium 3-trifluoromethylbenzenesulfonate or diphenyl-4-methylphenylsulfonium 3,5-di-trifluoromethylbenzenesulfonate, and said compound of the general formula [7] is triphenylsulfonium pentafluorobenzenesulfonate, triphenylsulfonium 3-trifluoromethylbenzenesulfonate or triphenylsulfonium 3,5-di-trifluoromethylbenzenesulfonate, and said compound of the general formula [12] is diphenyliodonium nonafluorobutanesulfonate, diphenyliodonium heptadecafluorooctanesulfonate, diphenyliodonium pentafluorobenzenesulfonate, diphenyliodonium 3-trifluoromethylbenzenesulfonate, diphenyliodonium 3,5-di-trifluoromethylbenzenesulfonate, di-4-methylphenyliodonium nonafluorobutanesulfonate, di-4-methylphenyliodonium heptadecafluorooctanesulfonate, di-4-methylphenyliodonium pentafluorobenzenesulfonate, di-4-methylphenyliodonium 3-trifluoromethylbenzenesulfonate or di-4-methylphenyliodonium 3,5-di-trifluoromethylbenzenesulfonate.

7. The resist composition in accordance with claim 1, wherein said acid labile group represented by $R_3$ in the general formula [5] is a branched or a cyclic tertiary alkyl group having 4-10 carbon atoms, an aralkyl group with a tertiary carbon atom having 9-24 carbon atoms, an alicyclic bridged hydrocarbon group with a tertiary carbon atom, a cyclic acetal group or a lactonyl group.

8. The resist composition in accordance with claim 7, wherein said acid labile group represented by $R_3$ in the general formula [5] is any one of a tert-butyl group, a 1-methylcyclohexyl group, a 1-adamantyl group, a 2-methyl-2-adamantyl group and a 4-methyl-2-oxo-4-tetrahydropyranyl group (a mevalonic lactonyl group).

9. The resist composition in accordance with claim 1, wherein said electron-withdrawing group represented by $R_5$ and $R_7$ in the general formula [6] and/or [7] is a halogen atom, a nitro group or a trifluoromethyl group.

10. The resist composition in accordance with claim 9, wherein further each of $R_9$ and $R_{10}$ in the general formula [6] and/or [7] is independently a hydrogen atom or a linear or a branched alkyl group having 1-4 carbon atoms.

11. The resist composition in accordance with claim 10, wherein a counter anion part of said compound to generate an acid by irradiation of radioactive ray represented by the general formula [6] and/or [7] is pentafluorobenzenesulfonate, 3-trifluoromethylbenzenesulfonate or 3,5-di-trifluoromethylbenzenesulfonate.

12. The resist composition in accordance with claim 1, wherein a polymer unit represented by the following general formula [13]:

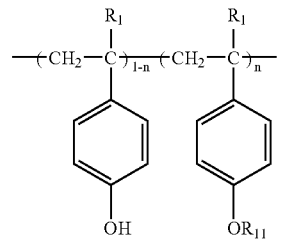

[wherein, $R_1$ is the same as described above; $R_{11}$ is an acid labile group which can be easily eliminated by an action of acid and bond to a phenol group to form an ether linkage or a carbonate linkage; and n is an integer] is further contained as a polymer.

13. The resist composition in accordance with claim 12, wherein a ratio by weight of said compound to generate an acid by irradiation of radioactive ray represented by the general formula [6] to said compound to generate an acid by irradiation of radioactive ray represented by the general formula [7] is in a range of 2:1 to 1:5.

14. The resist composition in accordance with claim 12, wherein said compound of the general formula [6] is diphenyl-2,4,6-trimethylphenylsulfonium pentafluorobenzenesulfonate, diphenyl-2,4,6-trimethylphenylsulfonium 3-trifluoromethylbenzenesulfonate, diphenyl-2,4,6-trimethylphenylsulfonium 3,5-di-trifluoromethylbenzenesulfonate, diphenyl-4-methylphenylsulfonium pentafluorobenzenesulfonate, diphenyl-4-methylphenylsulfonium 3-trifluoromethylbenzenesulfonate or diphenyl-4-methylphenylsulfonium 3,5-di-trifluoromethylbenzenesulfonate, and said compound of the general formula [7] is triphenylsulfonium pentafluorobenzenesulfonate, triphenylsulfonium 3-trifluoromethylbenzenesulfonate or triphenylsulfonium 3,5-di-trifluoromethylbenzenesulfonate.

15. The resist composition in accordance with claim 12, wherein at least one kind of compound represented by the following general formula [12]:

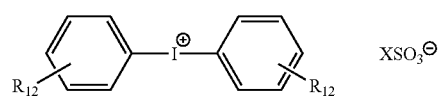

[wherein, $R_{12}$ is independently a hydrogen atom or a linear or a branched alkyl group having 1-5 carbon atoms; and X is a haloalkyl group having 3-8 carbon atoms or an aryl group optionally having a substitution group selected from a halogen atom, a lower haloalkyl group and a nitro group] is further added as a compound to generate an acid by irradiation of radioactive ray.

16. The resist composition in accordance with claim 15, wherein a ratio by weight of said compound to generate an acid by irradiation of radioactive ray represented by the general formula [6] to said compound to generate an acid by irradiation of radioactive ray represented by the general formula [7] is in a range of 2:1 to 1:5, and a ratio of total weight of said compound to generate an acid by irradiation of radioactive ray represented by the general formula [6] and said compound to generate an acid by irradiation of radioactive ray represented by the general formula [7] to a weight of said compound to generate an acid by irradiation of radioactive ray represented by the general formula [12] is in a range of 50:1 to 1:5.

17. The resist composition in accordance with claim 15, wherein said compound of the general formula [6] is diphenyl-2,4,6-trimethyl-phenylsulfonium pentafluorobenzenesulfonate, diphenyl-2,4,6-trimethylphenylsulfonium 3-trifluoromethylbenzenesulfonate, diphenyl-2,4,6-trimethylphenylsulfonium 3,5-di-trifluoromethylbenzenesulfonate, diphenyl-4-methylphenylsulfonium pentafluorobenzenesulfonate, diphenyl-4-methylphenylsulfonium 3-trifluoromethylbenzenesulfonate or diphenyl-4-methyl phenylsulfonium 3,5-di-trifluoromethylbenzenesulfonate, and said compound of the general formula [7] is triphenylsulfonium pentafluorobenzenesulfonate, triphenylsulfonium 3-trifluoromethylbenzenesulfonate or triphenylsulfonium 3,5-di-trifluoromethylbenzenesulfonate, and said compound of the general formula [12] is diphenyliodonium nonafluorobutanesulfonate, diphenyliodonium heptadecafluorooctanesulfonate, diphenyliodonium pentafluorobenzenesulfonate, diphenyliodonium 3-trifluoromethylbenzenesulfonate, diphenyliodonium 3,5-di-trifluoromethylbenzenesulfonate, di-4-methylphenyliodonium nonafluorobutanesulfonate, di-4-methylphenyliodonium heptadecafluorooctanesulfonate, di-4-methylphenyliodonium pentafluorobenzenesulfonate, di-4-methylphenyliodonium 3-trifluoromethylbenzenesulfonate or di-4-methylphenyliodonium 3,5-di-trifluoromethylbenzenesulfonate.

18. The resist composition in accordance with claim 12, wherein said acid labile group represented by $R_3$ in the general formula [5] is a branched or a cyclic tertiary alkyl group having 4-10 carbon atoms, an aralkyl group with a tertiary carbon having 9-24 carbon atoms, an alicyclic bridged hydrocarbon group with a tertiary carbon atom, a cyclic acetal group or a lactonyl group.

19. The resist composition in accordance with claim 18, wherein said acid labile group represented by $R_3$ in the general formula [5] is any one of tert-butyl group, a 1-methylcyclohexyl group, a 1-adamantyl group, a 2-methyl-2-adamantyl group and a 4-methyl-2-oxo-4-tetrahydropyranyl group (a mevalonic-lactonyl group).

20. The resist composition in accordance with claim 12, wherein said electron-withdrawing group represented by $R_5$ and $R_7$ in the general formula [6] and/or [7] is a halogen atom, a nitro group or a trifluoromethyl group.

21. The resist composition in accordance with claim 20, wherein, further each of $R_9$ and $R_{10}$ in the general formula [6] and/or [7] is independently a hydrogen atom or a linear or a branched alkyl groups having 1-4 carbon atoms.

22. The resist composition in accordance with claim 20, wherein a counter anion part of said compound to generate an acid by irradiation of radioactive ray represented by the general formula [6] and/or [7] is pentafluorobenzenesulfonate, 3-trifluoromethylbenzenesulfonate or 3,5-di-trifluoromethylbenzenesulfonate.

23. The resist composition in accordance with claim 1, wherein weight-average molecular weight of the polymer is 5,000 to 20,000 and distribution thereof is 1.0 to 2.5.

24. The resist composition in accordance with claim 1, wherein radioactive ray is electron beam, extreme ultraviolet ray or X-ray.

* * * * *